(12) United States Patent
Chang

(10) Patent No.: US 12,249,590 B2
(45) Date of Patent: Mar. 11, 2025

(54) DIE-GROUP PACKAGE HAVING A DEEP TRENCH DEVICE

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 427 days.

(21) Appl. No.: 17/700,447

(22) Filed: Mar. 21, 2022

(65) Prior Publication Data

US 2022/0367406 A1    Nov. 17, 2022

Related U.S. Application Data

(60) Provisional application No. 63/189,110, filed on May 15, 2021.

(51) Int. Cl.
| | | |
|---|---|---|
| *H01L 21/48* | (2006.01) | |
| *H01L 23/00* | (2006.01) | |
| *H01L 23/64* | (2006.01) | |
| *H01L 25/00* | (2006.01) | |
| *H01L 25/10* | (2006.01) | |

(52) U.S. Cl.
CPC .......... *H01L 24/80* (2013.01); *H01L 21/486* (2013.01); *H01L 23/642* (2013.01); *H01L 24/08* (2013.01); *H01L 25/105* (2013.01); *H01L 25/50* (2013.01); *H01L 2224/08146* (2013.01); *H01L 2225/107* (2013.01)

(58) Field of Classification Search
CPC ..... H01L 24/80; H01L 21/486; H01L 23/462; H01L 24/08; H01L 25/105; H01L 25/50
See application file for complete search history.

(56) References Cited

U.S. PATENT DOCUMENTS

| | | | | |
|---|---|---|---|---|
| 8,618,651 | B1* | 12/2013 | Yee ................... | H01L 23/49827 257/E21.597 |
| 10,943,883 | B1* | 3/2021 | Bonam .................. | H01L 25/18 |
| 11,158,590 | B1* | 10/2021 | Lan ........................ | H01L 21/288 |
| 11,320,588 | B1* | 5/2022 | Mazed ................... | G16H 10/40 |
| 11,417,628 | B2* | 8/2022 | Chen .................... | H10B 12/036 |
| 12,033,959 | B2* | 7/2024 | Chang .................... | H01L 25/50 |
| 2008/0169548 | A1* | 7/2008 | Baek ................... | H01L 23/5389 438/118 |
| 2009/0085217 | A1* | 4/2009 | Knickerbocker ....... | H01L 25/50 257/E23.141 |
| 2010/0052099 | A1* | 3/2010 | Chang .................. | H01L 23/642 257/E29.342 |
| 2011/0233757 | A1* | 9/2011 | O'Neill ................... | H01L 25/50 438/107 |

(Continued)

*Primary Examiner* — Nathan W Ha
(74) *Attorney, Agent, or Firm* — Kilpatrick Townsend & Stockton LLP

(57) ABSTRACT

A method of forming a package device includes providing a carrier substrate, forming a trench in a front side of the carrier substrate, and bonding a semiconductor die in the trench. The method also includes thinning a back side of the carrier substrate based on a target thickness to obtain a thinned carrier substrate. The method further includes providing a first die group and bonding the thinned carrier substrate to the first die group to form a height-adjusted first die group.

20 Claims, 14 Drawing Sheets

(56) References Cited

U.S. PATENT DOCUMENTS

| | | | |
|---|---|---|---|
| 2012/0139103 A1* | 6/2012 | New | H01L 23/481 |
| | | | 257/E23.079 |
| 2018/0331069 A1* | 11/2018 | Yu | H01L 21/565 |
| 2019/0164905 A1* | 5/2019 | Hsieh | H01L 23/552 |
| 2019/0304915 A1* | 10/2019 | Jain | H01L 28/40 |
| 2019/0393153 A1* | 12/2019 | Wang | H01L 21/76898 |
| 2020/0066922 A1* | 2/2020 | Cheng | H01L 27/016 |
| 2020/0091063 A1* | 3/2020 | Chen | H01L 25/0657 |
| 2020/0161235 A1* | 5/2020 | Kwon | H01L 23/642 |
| 2021/0184342 A1* | 6/2021 | Chen | H01Q 1/005 |
| 2021/0193548 A1* | 6/2021 | Wan | H01L 23/3736 |
| 2021/0202336 A1* | 7/2021 | Chang | H01L 24/32 |
| 2021/0305133 A1* | 9/2021 | Karhade | H01L 23/4825 |
| 2021/0305146 A1* | 9/2021 | Chen | H01L 25/50 |
| 2021/0366873 A1* | 11/2021 | Gandhi | H01L 24/73 |
| 2021/0398892 A1* | 12/2021 | Qiaoming | H01L 23/642 |
| 2022/0028825 A1* | 1/2022 | Jeng | H01L 25/50 |
| 2022/0068845 A1* | 3/2022 | Chen | H01L 23/10 |
| 2022/0084928 A1* | 3/2022 | Chen | H01L 23/147 |
| 2022/0165664 A1* | 5/2022 | Chang | H01L 23/585 |
| 2023/0097450 A1* | 3/2023 | Zhu | H01L 27/1203 |
| | | | 257/351 |

\* cited by examiner

DIE-GROUP PACKAGE HAVING A DEEP TRENCH DEVICE

CROSS-REFERENCES TO RELATED APPLICATIONS

The present application claims priority to U.S. Provisional Patent Application 63/189,110, filed on May 15, 2021, and entitled "SOIC CARRY WAFER EMBED VOLTAGE STABILIZER," the entire disclosure of which is incorporated herein by reference.

TECHNICAL FIELD

The present disclosure relates to a multi-chip package having a voltage stabilization device.

BACKGROUND

Semiconductor dies can be electrically connected with other circuitry in a package substrate. The package substrate provides for electrical connection to other circuitry on a printed circuit board. Semiconductor dies can have different functions and are difficult to be processed using the same semiconductor processing techniques; so they are manufactured separately. A large multi-functional device having high performance can be obtained by assembling multiple dies into the device. The multiple dies can be stacked together to form die groups, and the die groups can be mounted to the package substrate.

BRIEF DESCRIPTION OF THE DRAWINGS

The present disclosure is best understood from the following detailed description when read with the accompanying figures. It is noted that, in accordance with the standard practice in the industry, various features are not drawn to scale. In fact, the dimensions of the various features may be arbitrary increased or reduced for clarity of discussion.

DETAILED DESCRIPTION

Figure 1:
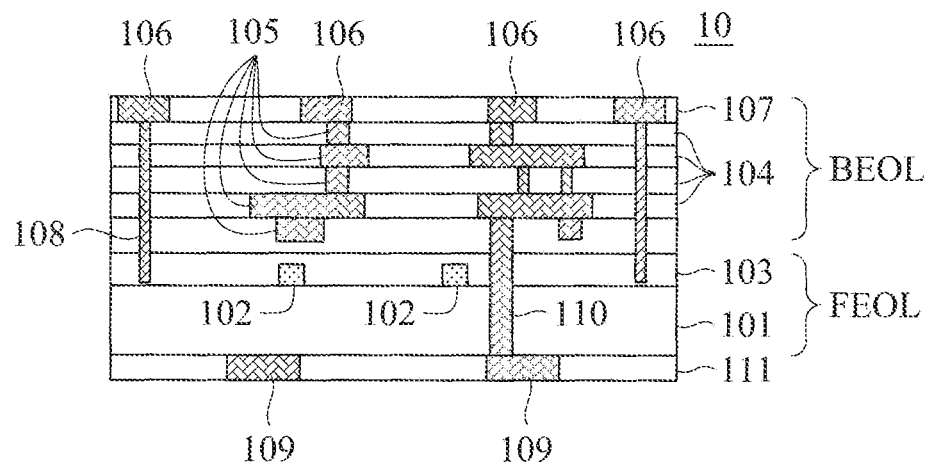
FIG. 1 is a simplified cross-sectional view of a die according to some exemplary embodiments.

The following disclosure provides many different embodiments or examples for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Prepositions, such as "on" and "side" (as in "sidewall") are defined with respect to the conventional plane or surface being on the top surface of the wafer or substrate, regardless of the orientation of the wafer or substrate. The term "horizontal" is defined as a plane parallel to the conventional plane or surface of a wafer or substrate, regardless of the orientation of the wafer or substrate. The term "vertical" refers to a direction perpendicular to the horizontal as defined above, i.e., perpendicular to the surface of a substrate. The terms "first," "second," "third," and "fourth" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

There are many packaging technologies to house the semiconductors such as the 2D fan-out (chip-first) IC integration, 2D flip chip IC integration, PoP (package-on-package), SiP (system-in-package) or heterogeneous integration, 2D fan-out (chip-last) IC integration, 2.1D flip chip IC integration, 2.1D flip chip IC integration with bridges, 2.1D fan-out IC integration with bridges, 2.3D fan-out (chip-first) IC integration, 2.3D flip chip IC integration, 2.3D fan-out (chip-last) IC integration, 2.5D (solder bump) IC integration, 2.5D (μbump) IC integration, μthump 3D IC integration, μbump chiplets 3D IC integration, bumpless 3D IC integration, bumpless chiplets 3D IC integration, SoIC and/or any other packaging technologies. It should be understood that various embodiments disclosed herein, although described and illustrated in a context of a specific semiconductor packaging technology, are not intended to limit the present disclosure only to that packaging technology. One skilled in the art would understand those embodiments may be applied in other semiconductor technologies in accordance with principles, concepts, motivations, and/or insights provided by the present disclosure.

System on integrated chip (SoIC) is a recent development in advanced packaging technologies. SoIC technology integrates both homogeneous and heterogeneous chiplets into a single System-on-Chip (SoC)-like chip with a smaller footprint and thinner profile, which can be holistically integrated into advanced WLSI (aka CoWoS® service and InFO). From external appearance, the newly integrated chip is just like a general SoC chip yet embedded with desired and heterogeneously integrated functionalities. SoIC realizes 3D chiplets integration with additional advantages in performance, power and form factor. Among many other features, the SoIC features ultra-high-density-vertical stacking for high performance, low power, and reduced RLC (resistance-inductance-capacitance). SoIC integrates active and passive chips into a new integrated-SoC system to achieve better form factor and performance. US Patent Publication #20200168527, entitled "SoIC chip architecture," provides some descriptions of some example SoIC structures. US Patent Publication #20200168527 is incorporated by reference in its entirety. Another example of SoIC™ can be found at https://3dfabric.tsmc.com/english/dedicated-Foundry/technology/SoIC.htm, which is also incorporated by reference in the present disclosure in its entirety.

Various embodiments relate to multi-chip devices having stacked chips disposed on a base structure. As used herein, chips and dies are used interchangeably and refer to pieces of a semiconductor wafer, to which a semiconductor manufacturing process has been performed, formed by separating the semiconductor wafer into individual dies. A chip or die can include a processed semiconductor circuit having a same hardware layout or different hardware layouts, same functions or different functions. In general, a chip or dies has a substrate, a plurality of metal lines, a plurality of dielectric layers interposed between the metal lines, a plurality of vias electrically connecting the metal lines, and active and/or passive devices. The dies can be assembled together to be a multi-chip device or a die group. As used herein, a chip or die can also refer to an integrated circuit including a circuit configured to process and/or store data. Examples of a chip, die, or integrated circuit include a field programmable gate array (e.g., FPGA), a processing unit, e.g., a graphics processing unit (GPU) or a central processing unit (CPU), an application specific integrated circuit (ASIC), memory devices (e.g., memory controller, memory), and the like.

In accordance with the present disclosure, a die-group package having an embedded deep trench capacitor (DTC) is provided. In various embodiments, the die-group package includes a carrier substrate disposed on a first die group, a second die group, a base die group having the first die group and the second die group disposed thereon, and any other components (if any). In those embodiments, the first die group and the second die group have a height difference, and a carrier substrate is disposed on the first die group to more or less compensate that height difference. In those embodiments, the DTC is embedded in the carrier substrate and is connected to the first die group through one or more interconnects in the first group. In this way, a form factor of the die-group package is improved because the DTC and carrier substrate occupy a same space rather than two different spaces in the die-group package.

In accordance with the present disclosure, a method for fabricating a die-group package having an embedded DTC is provided. In various embodiments, the method includes etching a DTC space within a carrier substrate, growing a liner in the space, fusion bonding a DTC die in the DTC space, filling one or more gaps within the DTC space, planarizing the DTC space, hybrid bonding the carrier substrate onto a first die group of the die group structure, planarizing the carrier substrate to make a combined height of the first die group and the carrier substrate more or less the same as a second die group of the die-group structure.

Dies and Die Groups in Accordance with the Present Disclosure

In this section, an example individual die structure, an example stacked die structure in a die group, and an example wafer-on-wafer configuration having the example stacked die structure are provided to illustrate some embodiments where the present disclosure may be applied. It should be understood that the examples shown in this section are merely illustrative for understanding how the present disclosure may be applied in those examples. Thus, these examples should not be construed as being intended to limit the present disclosure. One skilled in the art will understand the present disclosure may be applied in other semiconductor packaging technologies wherever appropriate.

An Example Individual Die Structure in Accordance with the Present Disclosure

FIG. 1 is a structure of a semiconductor device 10 according to some exemplary embodiments. One or more of such a semiconductor device may be arranged on an individual die in a die group in various embodiments. Referring to FIG. 1, the semiconductor device 10 includes a substrate 101, an active region 102 formed on a surface of the substrate 101, a plurality of dielectric layers 103, a plurality of metal lines and a plurality of vias 105 and 108 formed in the dielectric layers 104, and a metal structure 106 in a top intermetal layer 107. In the example of FIG. 1, the semiconductor device 10 also includes trans-substrate via (TSV) (110), and back side contacts 109 formed in a backside dielectric layer 111 on the back side of substrate 101. In an embodiment, the semiconductor device 10 can also include passive devices, such as resistors, capacitors, inductors, and the like (not shown). The substrate 101 can be a semiconductor substrate or a non-semiconductor substrate. For example, the substrate 101 may include a bulk silicon substrate. In some embodiments, the substrate 101 may include an elementary semiconductor, such as silicon or germanium in a crystalline structure, a compound semiconductor, e.g., silicon germanium, silicon carbide, gallium arsenic, gallium phosphide, indium phosphide, indium arsenide, and/or indium antimonide, or combinations thereof. Possible substrate 101 may also include a semiconductor-on-insulator (SOI) substrate. In an embodiment, the substrate 101 is a silicon layer of an SOI substrate. The substrate 101 can include various doped regions depending on design requirements, e.g., n-type wells or p-type wells. The doped regions are doped with p-type dopants, e.g., boron, n-type dopants, e.g., phosphorous or arsenic, or combination thereof. The active region 102 may include transistors. The dielectric layers 103 may include interlayer dielectric (ILD) and intermetal dielectric (IMD) layers. The ILD and IMD layers may be low-k dielectric layers which have dielectric constants (k values) smaller than a predetermined value, e.g., about 3.9, smaller than about 3.0, smaller than about 2.5 in some embodiments. In some other embodiments, the dielectric layers 103 may include non-low-k dielectric materials having dielectric constants equal to or greater than 3.9. The metal lines and vias may include copper, aluminum, nickel, tungsten, or alloys thereof.

An Example Stacked Die Structure in Accordance with the Present Disclosure

Figure 2:
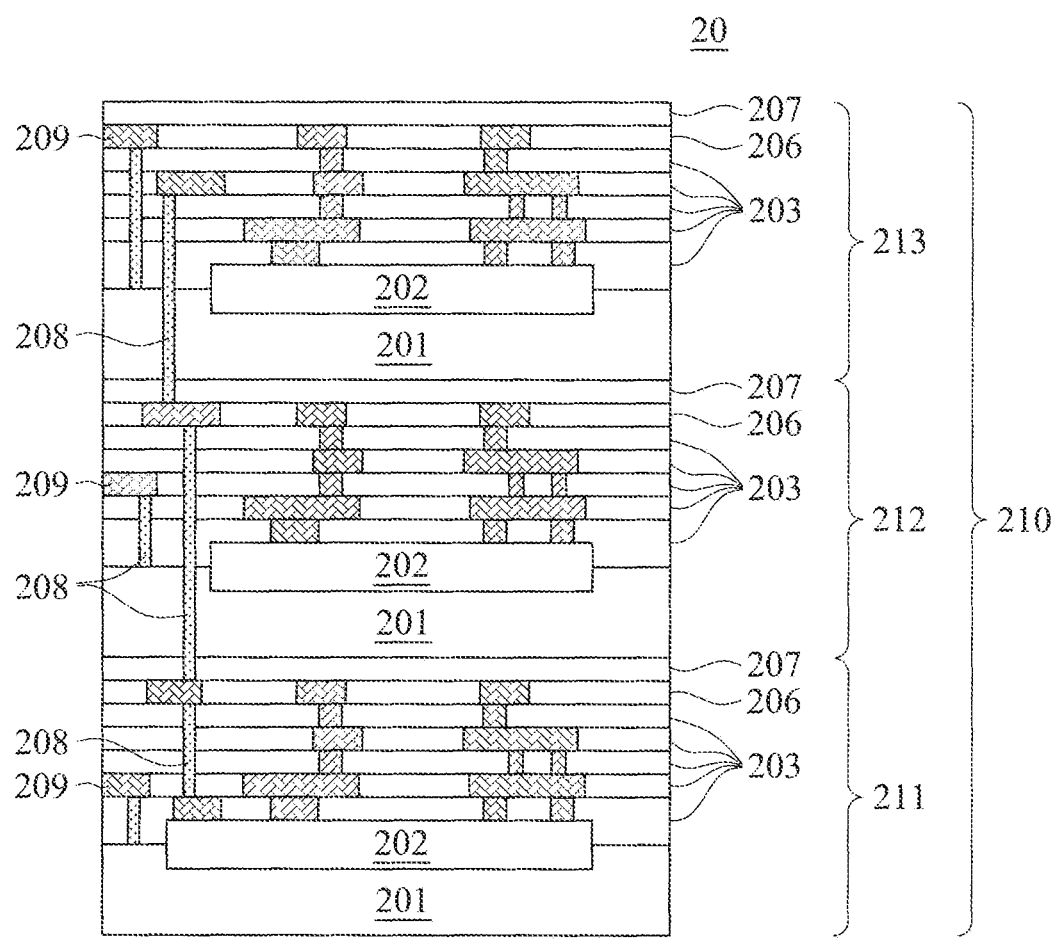
FIG. 2 is a cross-sectional view of a die group 20 having a plurality of dies stacked with each other according to some exemplary embodiments.

FIG. 2 is a cross-sectional view of a die group 20 having a plurality of dies stacked on top of each other horizontally according to some embodiments. Referring to FIG. 2, the die group 20 includes a stacked die structure 210 including a plurality of dies 211, 212, and 213 stacked on top of each other in a substantially horizontal arrangement. As shown, in this example, each of the dies 211-213 in the die group includes a semiconductor device similar to the semiconductor device 10 described and illustrated in connection with FIG. 1. It should be understood although 3 dies are shown to be in the stacked die structure 210, this is not intended to be limiting. One skilled in the art will understand that a stacked die structure in accordance with the present disclosure can include a greater or fewer number of dies than those shown in FIG. 2.

As can be seen, in this example, the stacked dies in the stacked die structure 210 are bonded to each other through bonding members 214. In some implementations, the bonding members 214 include hybrid bonding films. However, this is not intended to be limiting. It is understood that the bonding members 214, in accordance with the present disclosure, are not limited to hybrid bonding films. For example, it is contemplated that the bonding members 214 may include micro bumps, solder balls, metal pads, and/or any other suitable bonding structures.

As also can be seen, each of the stacked dies 211, 212, and 213 includes a substrate 201, an active region 202 formed on a surface of the substrate 201, a plurality of dielectric layers 203, a plurality of metal lines and a plurality of vias 204 formed in the dielectric layers 203, and a passivation layer 207 on a top inter-metal layer 206. In an embodiment, a stacked die can also include passive devices, such as resistors, capacitors, inductors, and the like. The substrate 201 can be a semiconductor substrate or a non-semiconductor substrate. For example, the substrate 201 may include a bulk silicon substrate. In some embodiments, the substrate 201 may include an elementary semiconductor, such as silicon or germanium in a crystalline structure, a compound semiconductor, e.g., silicon germanium, silicon carbide, gallium arsenic, gallium phosphide, indium phosphide, indium arsenide, or combinations thereof. Possible substrate 201 may also include a semiconductor-on-insulator (SOI) substrate. In an embodiment, the substrate 201 is a silicon layer of an SOI substrate. The substrate 201 can include various doped regions depending on design requirements, e.g., n-type wells or p-type wells. The doped regions are doped with p-type dopants, e.g., boron, n-type dopants, e.g., phosphorous or arsenic, or combinations thereof. The active region 102 may include transistors. The dielectric layers 203 may include interlayer dielectric (ILD) and intermetal dielectric (TMD) layers. The ILD and IMD layers may be low-k dielectric layers which have dielectric constants (k values) smaller than a predetermined value, e.g., about 3.9, smaller than about 3.0, smaller than about 2.5 in some embodiments. In some other embodiments, the dielectric layers 203 may include non-low-k dielectric materials having dielectric constants equal to or greater than 3.9. The metal lines and vias may include copper, aluminum, nickel, tungsten, or alloys thereof.

In this example, the die group 20 includes through silicon vias (TSVs) or through oxide vias (TOVs) 208 configured to electrically connect the metal lines in the stacked dies 211, 212, and 213 with each other. In an implementation, an individual TSV/TOV 208 may include copper, aluminum, tungsten, alloys thereof, and/or any other suitable materials. TSV/TOVs 208 are arranged in this example to facilitate electronic communication between and among stacked dies 211, 212 and 213. However, it is understood that in some other semiconductor packaging technologies where the present disclosure applies, TSV/TOVs may not be present and thus the TSV/TOVs 208 shown in this example shall not be construed as being intended to limit the present disclosure.

In this example, each of the stacked dies 211, 212, and 213 also includes a side metal interconnect structure 209 on a sidewall of the stack dies. The side metal interconnect structure 209 may include one or more metal wirings extending through an exposed surface of the plurality of dielectric layers 203. The side metal interconnect structure 209 may be formed at the same time as the metal layers and exposed to the side surface of the die group 20 after the different dies 211, 212, and 213 have been bonded together and the side surface is polished by a chemical mechanical polishing (CMP) process.

In some embodiments, the die group 20 can be formed by bonding a plurality of wafers together using fusion bonding, eutectic bonding, metal-to-metal bonding, hybrid bonding processes, and the like. A fusion bonding includes bonding an oxide layer of a wafer to an oxide layer of another wafer. In an embodiment, the oxide layer can include silicon oxide. In an eutectic bonding process, two eutectic materials are placed together, and are applied with a specific pressure and temperature to melt the eutectic materials. In the metal-to-metal bonding process, two metal pads are placed together, and a pressure and high temperature are provided to the metal pads to bond them together. In the hybrid bonding process, the metal pads of the two wafers are bonded together under high pressure and temperature, and the oxide surfaces of the two wafers are bonded at the same time.

In some embodiments, each wafer may include a plurality of dies, such as semiconductor devices of FIG. 1. The bonded wafers contain a plurality of die groups having a plurality of stacked dies. The bonded wafers are singulated by mechanical sawing, laser cutting, plasma etching, and the like to separate into individual die groups that can be the die group as shown in FIG. 2.

An Example Wafer-On-Wafer Configuration

Figure 3A:
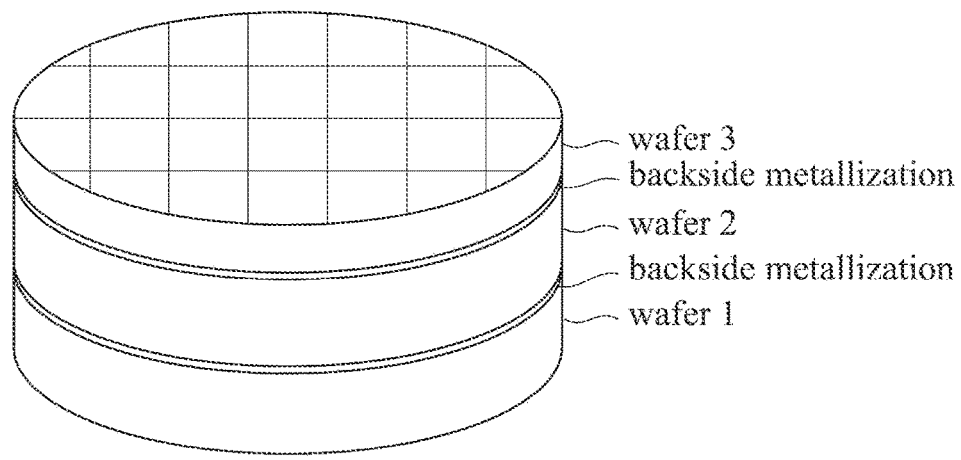
FIG. 3A is a simplified perspective view illustrating a plurality of wafers stacked on top of each other in a three-dimensional (3D) configuration according to some embodiments.

FIG. 3A is a simplified perspective view illustrating a plurality of wafers stacked on top of each other in a three-dimensional (3D) configuration according to some embodiments. Referring to FIG. 3A, a first wafer "wafer 1" is a base wafer on which a plurality of dies can be formed. A second wafer "wafer 2" is an intermediate wafer on which a plurality of dies can be formed, and a third wafer "wafer 3" is a top wafer on which a plurality of dies can be formed. The wafers may have through substrate vias and/or through oxide vias and a backside bonding layer (e.g., metallization layer and/or dielectric layer) and are bonded together to form a 3D stacked wafer configuration using any known bonding techniques, e.g., fusion bonding, eutectic bonding, metal bonding, hybrid bonding, and the like. The three wafers are electrically connected to each other through substrate vias, through oxide vias, and/or backside metallization layer and dielectric layer. The wafers each can have different dies. For example, wafer 1 may include dies of central processing units, graphics processing units, and logic; wafer 2 may include dies of memory devices and memory controllers; and wafer 3 may include dies of bus interfaces, input/output ports, and communication and networking devices. In the example shown in FIG. 3A, three wafers are used, but it is understood that the number is illustrative only and is chosen for describing the example embodiment and should not be limiting. In some embodiments, a passivation layer is formed on the upper surface of each of the wafers and includes a thickness to provide separation between the substrate and the metallization layer. The passivation layer includes an oxide material.

Figure 3B:
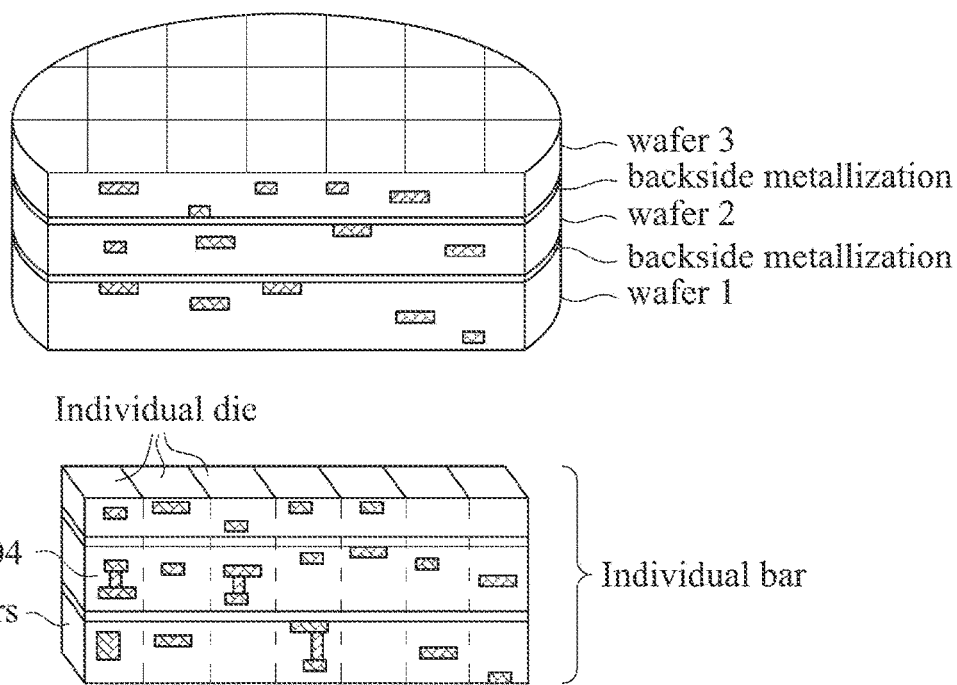
FIG. 3B is a simplified perspective view illustrating the stacked wafer configuration of FIG. 3A.

FIG. 3B is a simplified perspective view illustrating the stacked wafer configuration of FIG. 3A that has been cut and separated into individual bars according to an exemplary embodiment. For example, the stacked wafers can be cut into individual bars and individual die groups by mechanical sawing, plasma etching, laser cutting, and the like. Referring to FIG. 3B, each of the wafers include a substrate, a plurality of dielectric layers including interlayer dielectric layers (ILDs) and intermetal dielectric layers (IMDs), and a plurality of metal lines and a plurality of vias 104 formed in the dielectric layers. The dies of the stacked wafers are electrically coupled to each other through substrate vias and through oxide vias. In some embodiments, the individual bars are placed on a polishing board, and the surfaces of the bars are polished prior to being diced or singulated into dies.

Figure 3C:
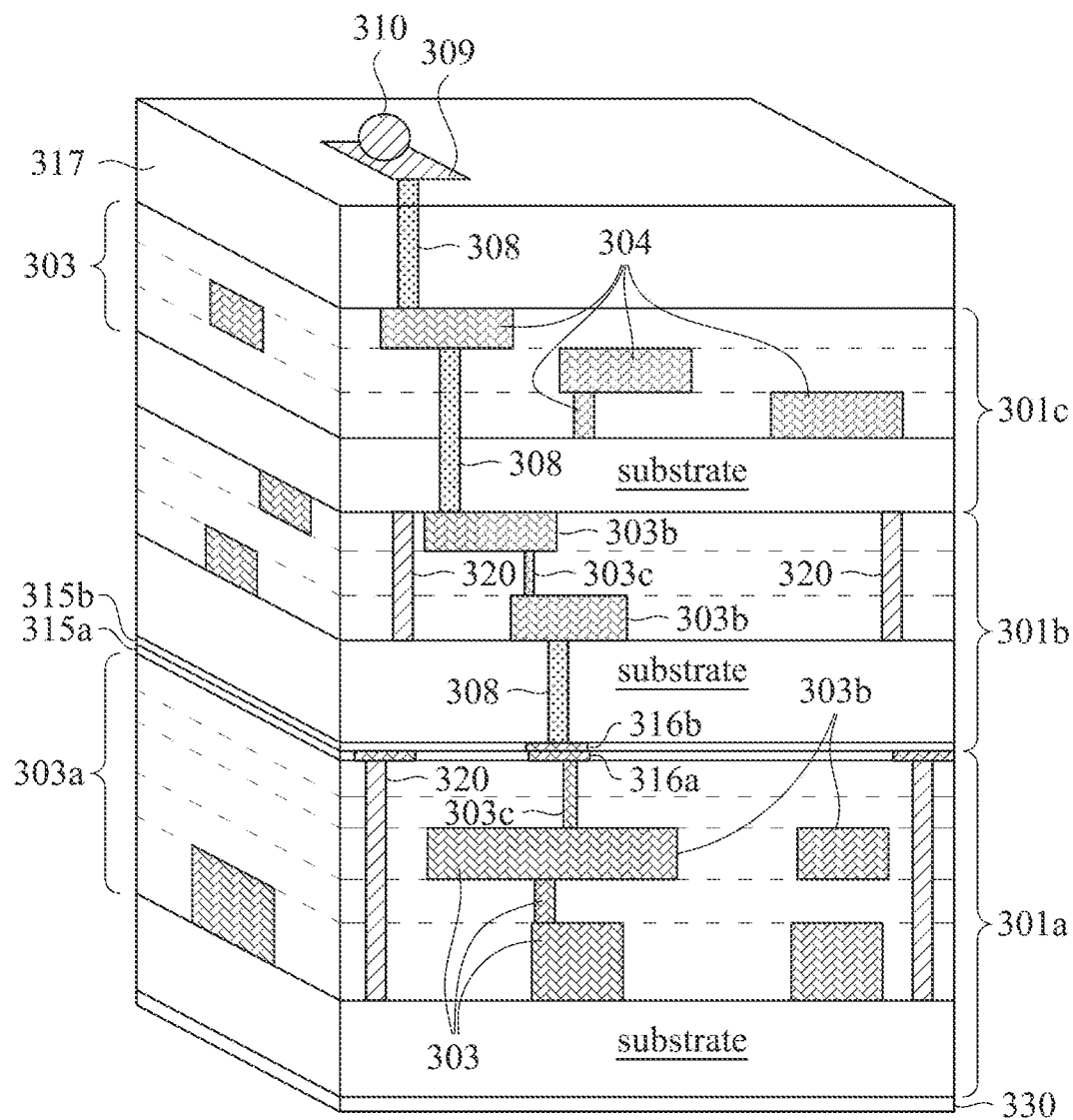
FIG. 3C is a simplified perspective view of an individual die group 30 including a plurality of stacked dies according to an exemplary embodiment.

FIG. 3C is a simplified perspective view of an individual die group 30 including a plurality of stacked dies according to an exemplary embodiment. Referring to FIG. 3C, the die group 30 includes a first die 301a, a second die 301b, and a third die 301c stacked on top of each other. Each of the first, second, and third dies may include a substrate, an active region including a plurality of active devices (not shown), an interconnect structure 303 formed on the substrate and configured to electrically connect the active region of each die with each other. The interconnect structure 303 may include a plurality of dielectric layers 303a, metal lines 303b formed in the dielectric layers 303a, and vias 303c connecting metal lines 303b in different layers. In some embodiments, the dielectric layers 303a include silicon oxide, silicon nitride, silicon carbide, silicon oxynitride, and/or combinations thereof. In some embodiments, the dielectric layers 303a may include one or more low-k dielectric layers having low k values. In some embodiments, the k values of the low-k dielectric materials may be lower than about 3.0.

In some embodiments, the dies are electrically coupled to each other by through substrate vias (TSVs) and through oxide vias (TOVs) 308. In some embodiments, the die group 30 also includes a bonding layer 317 including an oxide material, e.g., silicon oxide. In some embodiments, the bonding layer 317 may include a plurality of bonding films and electrical connectors 309 having a plurality of solder regions. In some embodiments, the electrical connectors 309 include copper posts, solder caps, and/or electrically conductive bumps 310 configured to electrically coupled to other electronic circuits on a printed circuit board or other substrates. In some embodiments, the die group 30 includes a plurality of semiconductor dies or chips similar to those of FIG. 2. In an embodiment, the stacked dies of the die group 30 include logic devices, input/output (IO) devices, processing units, e.g., data processing units, graphics processing unit, application specific integrated circuits (ASIC), field programmable gate arrays (FPGA), other applicable types of devices. In some embodiment, the die group 30 is a system-on-integrated circuits (SoIC) device that includes multiple functions. In the example shown in FIG. 3A, three dies are shown, but it is understood that the number is illustrative only and is chosen for describing the example embodiment and should not be limiting. For example, the die group 30 can include a single die, two dies, or more than three dies. In some embodiments, the die group 30 may be bonded to a package substrate (e.g., an interposer, a printed circuit board) through flip-chip bonding using the electrical connectors 309.

In some embodiments, the dies are bonded to each other by a hybrid bonding process. In an embodiment, the first die 301a has a first bonding surface formed on its upper surface including a first bonding dielectric layer 315a and a first conductive contact structure 316a. The second die 301b has a second bonding surface formed on a bottom of its substrate, the second bonding surface includes a second bonding dielectric layer 315b and a conductive contact structure 316b. In an embodiment, the first and second conductive contact structures 316a, 316b may be electrically coupled to the interconnect structure 303. In another embodiment, the first and second conductive contact structures 316a, 316b may not be electrically coupled to the interconnect structure 303. In an embodiment, the first die 301a and the second die 301b are directly hybrid bonded together, such that the first and second conductive contact structures 316a, 316b are bonded together, and the first and second bonding dielectric layers 315a, 315b are bonded together. In an embodiment, the first and second bonding dielectric layers 315a, 315b each include silicon oxide, and the first and second conductive contact structures 316a, 316b each include copper.

In an embodiment, the dies also include a seal ring 320 configured to stop cracks generated by stress during the bonding processes and/or the singulation. The seal ring 320 is also configured to prevent water, moisture, and other pollutant from entering the dies. In an embodiment, the seal ring 320 includes copper configured to suppress electromagnetic noise. In an embodiment, the first die 301a may include a bonding dielectric layer 330 configured to be bonded to a carrier substrate by fusion bonding.

Uneven Stacking of Die Groups

Figure 4:
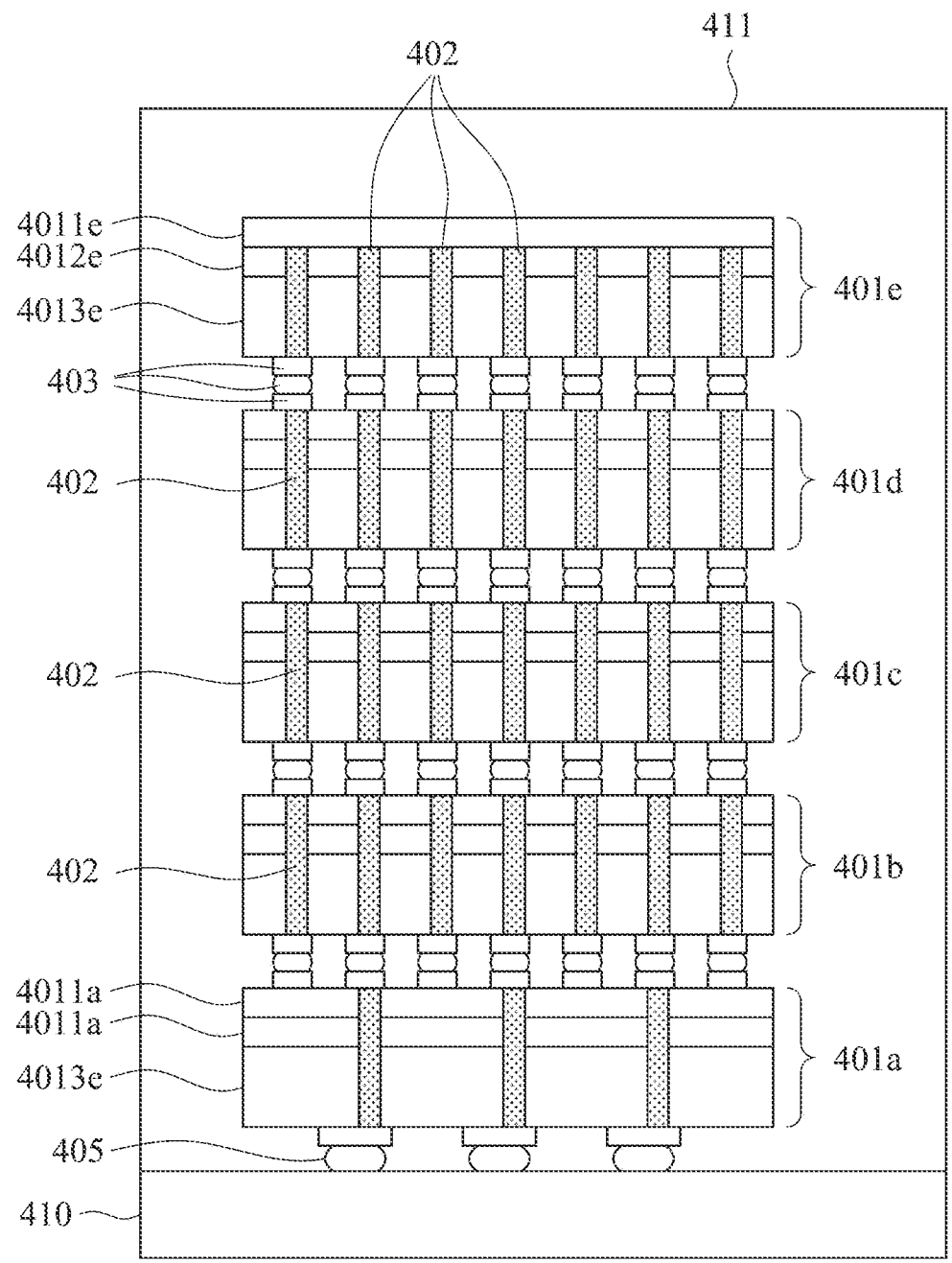
FIG. 4 is a simplified cross-sectional view of a die group 40 including a plurality of stacked dies according to an exemplary embodiment.

In various embodiments, due to a design choice, a functional requirement, and/or any other consideration, two die groups stacked on a base die group in a die group structure have different heights. The difference of their heights, in some embodiments, may exceed a threshold and cause potential warpage or crack in the base die group. FIGS. 4-5 are illustrated and described herein to show such an uneven stacking of die groups.

FIG. 4 is a simplified cross-sectional view of a die group 40 including a plurality of stacked dies according to an exemplary embodiment. The die group 40 can be included in a die-group structure in accordance with the present disclosure. Referring to FIG. 4, the die group 40 includes a plurality of dies that are stacked on top of each other. In an exemplary embodiment, the die group 40 includes dies 401a, 401b, 401c, 401d, and 401e. In an exemplary embodiment, each die includes a substrate 4011, a front-end-of-line (FEOL) structure 4012, and a back-end-of-line structure 4013. The FEOL structure generally includes a first portion of a fabrication of an integrated circuit, such as forming trench isolation structures, performing implants for forming wells, forming active regions, e.g., source/drain regions, gate structures, and interlayer dielectric layers. The BEOL structure generally includes forming electrically conductive lines, and vias in intermetal dielectric layers to electrically couple electronic circuits formed on the substrate. In some embodiments, the dies 401a, 401b, 401c, 401d, and 401e are memory dies. The memory dies may include memory devices, such as static random access memory (SRAM) devices, dynamic random access memory (DRAM) devices, other suitable devices, or a combination thereof. In some embodiments, the die 401a is a memory controller die that is electrically connected to the memory dies 401b, 401c, 401d, and 401e disposed thereon. In some embodiments, the die group 40 may function as a high bandwidth memory (HBM). In the example shown in FIG. 4, five dies are shown, but it is understood that the number is illustrative only and is chosen for describing the example embodiment and should not be limiting. For example, the die group 40 can include fewer or more than five dies in some embodiments.

In some embodiments, the die group 40 also includes a plurality of conductive features 402 extending through the dies 401a to 401e and electrically coupled to a plurality of conductive bonding structures 403 disposed between the dies 401a, 401b, 401c, 401d, and 401e to electrically bond them together. The conductive features 402 are configured as through-substrate vias (TSVs) to electrically connect the dies with each other. In an embodiment, the conductive bonding structures 403 include tiny solder bumps, such as controlled collapse chip connection (C4) bumps or ball grid array (BGA) bumps and pillars formed on an upper surface of a die using various process steps. In some embodiments, the die group 40 also includes a bonding structure 405 formed on a surface of the BEOL structure of the die 401a and configured to bond the die group 40 to a substrate 410. The die group 40 is flipped over and mounted on the substrate 410. In some embodiments, the die group 40 also includes a molding compound layer 411 that encapsulates the dies 401a, 401b, 401c, 401d, and 401e. The molding compound layer 411 includes an epoxy-based resin or other suitable material. In some embodiments, the molding compound layer 411 fills the air gaps between the dies 401a, 401b, 401c, 401d, and 401e and surrounds the conductive bonding structures 403 and 405.

Figure 5A:
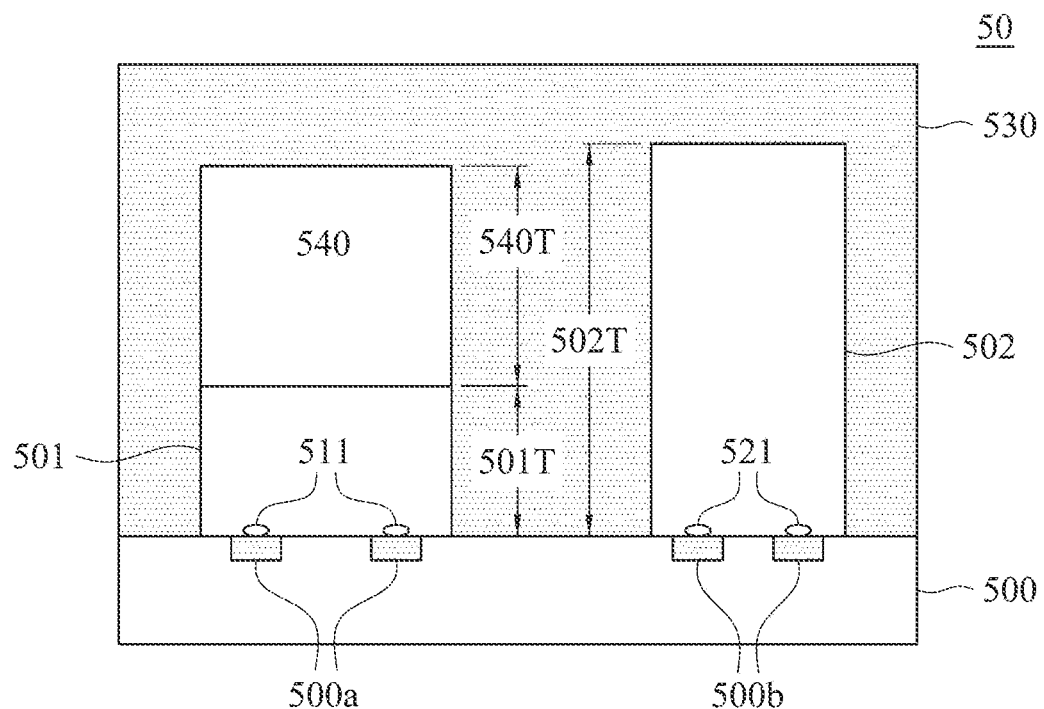
FIG. 5A is a simplified cross-sectional view of a package device according to an embodiment.

FIG. 5A is a simplified cross-sectional view of a package device 50 according to an embodiment. Referring to FIG. 5A, the package device 50 includes a package substrate 500, a first die group 501, and a second die group 502. As can be seen, in FIG. 5A, the first die group 501 and the second die group 502 are bonded onto the package substrate 500. In an implementation, a bonding process used to bond die groups 501 and/or 502 can include through fusion bonding, eutectic bonding, metal-to-metal bonding, hybrid bonding processes, and the like. A fusion bonding includes bonding an oxide layer of a wafer to an oxide layer of another wafer. In an embodiment, the oxide layer can include silicon oxide. In an eutectic bonding process, two eutectic materials are placed together, and are applied with a specific pressure and temperature to melt the eutectic materials. In the metal-to-metal bonding process, two metal pads are placed together; a pressure and high temperature are provided to the metal pads to bond them together. In the hybrid bonding process, the metal pads of the two wafers are bonded together under high pressure and temperature, and the oxide surfaces of the two wafers are bonded at the same time.

In some embodiments, the first die group 501 includes a plurality of dies stacked with other through hybrid bonding. In those embodiments, the second die group 502 includes a plurality of dies stacked onto each other through metal-to-metal bonding. In one implementation, the first die group 501 is the die group 30 shown and described with reference to FIG. 3C. In another implementation, the second die group 502 is the die group 40 shown and described with reference to FIG. 4. The first die group 501 and the second die group 502 each has a planar upper surface. Referring to FIG. 5A, the package substrate includes a plurality of bond pads 500a, 500b, the first die group 501 is flip-chip mounted over the package substrate 500 by attaching conductive bumps 511 to the bond pads 500a, and the second die group 502 is mounted over the package substrate 500 by attaching conductive bumps 521 to the bond pads 500b. The package substrate includes a plurality of electrically conductive wires configured to electrically connect the first and second die groups.

Figure 5B:
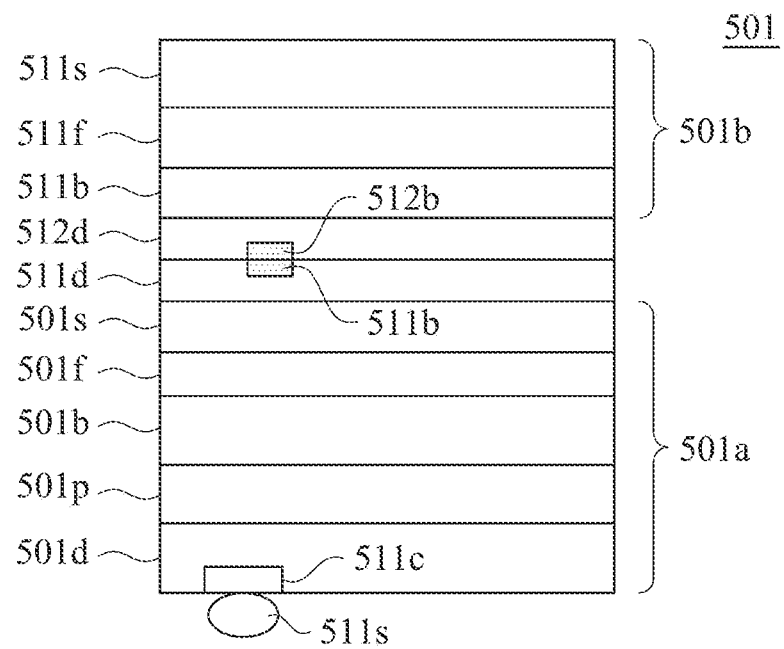
FIG. 5B is a cross-sectional view of a first die group according to an embodiment.

FIG. 5B is a cross-sectional view of first die group 501 shown in FIG. 5A according to an embodiment. Referring to FIG. 5B, the first die group 501 includes a first die 501a having a substrate 501s, a FEOL structure 501f formed on the substrate 501s, a BEOL structure 501b formed on the FEOL structure 501f, a passivation layer 501p on the BEOL structure 501b, and a dielectric layer 501d on the passivation layer 501p. In an embodiment, the first die 511 also includes a contact pad 511c and a solder ball 511s formed on the contact pad 511c. In an embodiment, the FEOL structure 511f may include one or more dielectric layers having a suitable material, such as silicon oxide, silicon nitride, low-k dielectrics, e.g., carbon doped oxides, extremely low-k dielectrics, such as porous carbon doped silicon dioxide, the like, or a combination thereof. The BEOL structure may include one or more intermetal dielectric layers, patterned metal lines, and vias.

In an embodiment, the first die group 501 also includes a second die 501b having a substrate 511s, a FEOL structure 511f formed on the substrate 511s, a BEOL structure 511b formed on the FEOL structure 511f, a dielectric layer 512d formed on a surface of the BEOL structure 512b, and a bonding structure 512b in the dielectric layer 512d. In an embodiment, second die 501b is bonded to the first die 501a by hybrid bonding, i.e., a metal surface of the bonding structure 512b of the second die 501b is bonded to a metal surface of a bonding structure 511b in a dielectric layer 511d disposed on a lower surface of the first die 501a, and the surfaces of the dielectric layers 512d and 511d are bonded together.

Figure 5C:
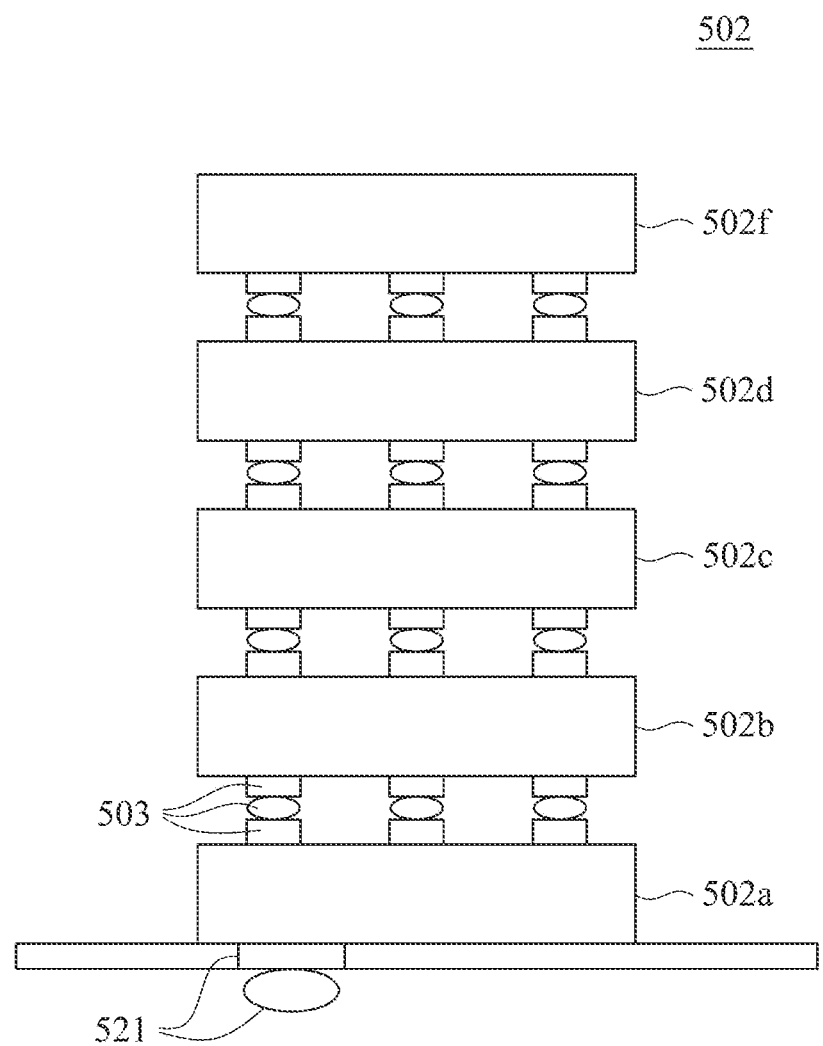
FIG. 5C is a simplified cross-sectional view of a second die group according to an embodiment.

FIG. 5C is a cross-sectional view of second die group 502 shown in FIG. 5A according to an embodiment. Referring to FIG. 5C, the second die group 502 includes a plurality of dies 502a, 502b, 502c, 502d, 502e stacked on top of each other. The dies 502a, 502b, 502c, 502d, 502e are electrically connected to each other through a plurality of conductive bonding structures 503. In an embodiment, the die 401 also includes a conductive bump 521 formed on a surface of the die 401a and configured to bond the die group 502 to the substrate 500. The second die group 502 also includes a molding compound layer 511 that encapsulates the dies 501a, 501b, 501c, 501d, and 501e.

In some embodiments, the first die group 501 and the second die group 502 are bump bonded to the substrate 500. The substrate 500, the first die group 501, and the second die group 502 may have different coefficients of thermal expansion (CTEs). The different CTEs will induce thermal stress when the temperature in the package device 50 changes.

Referring back to FIG. 5A, package device 50 is subjected to a molding operation. In an exemplary molding operation, a mold compound 530 is formed over the first die group 510, the second die group 520, and the substrate 500. In a compression molding process, a liquid thermoset epoxy resin mold compound may be used in a compress molding machine, and the mold compound may be heated to an elevated temperature where it becomes a lower viscous liquid, and surrounds the first die group 510, the second die group 520, and the substrate 500. The mold compound 530 solidifies when cooled and is then released from the compress molding machine. After the mold compound 530 is cured, a grinding operation may be performed to remove a top portion of the mold compound 530. Because the CTE of epoxy does not match the CTE of silicon, when the epoxy resin mold compound is adhered to the die groups 501 and 502, the CTE mismatch introduces thermal stress on the die groups 501 and 502. In an embodiment, the mold compound 530 includes a material similar or substantially the same to the material of the molding compound layer 411. In an embodiment, the mold compound 530 is a high thermal conductivity mold compound for good heat dissipation.

As also can be seen in FIG. 5A, a height 501T (or thickness) of die group 501 is lower than a height (or thickness) 502T of die group 502. It has been observed, when the height difference between die group 501 and die group 502 exceeds a threshold, stress can build up at package substrate 500. For addressing stress buildup on the package substrate 500, in one embodiment, a stress relief feature is configured in the package 50 to compensate for the height difference between the first and second die groups 501 and 502 by attaching a dummy wafer 540 (e.g., a carrier wafer or substrate) to an upper surface of the first die group. In some embodiments, dummy wafer 540 is formed from a silicon (Si) wafer, a germanium (Ge) wafer, and/or a silicon-germanium (SiGe) wafer, etc. In one embodiment, the dummy wafer 540 having a height 540T is attached to the upper surface of the first die group through fusion bonding.

In some embodiments, for disposing the dummy wafer 540, a height difference between the first die group 501 and the second die group 502 is determined, and the dummy wafer 540 is provided on first die group 501 according to the determined height difference. This may include thinning the dummy wafer 540 based on the height difference to obtain a thinned dummy wafer 540, and mounting the thinned dummy wafer 540 to the first die group 501 to form a height-adjusted first die group 501 having a combined height (501T+540T) within a height range of the second die group. In an embodiment, the combined height (501T+540T) is within 10% (plus or minus) of the height 502T of the second die group.

Embedded DTC in a Carrier Substrate in a Die-Group Package

Figure 6A:
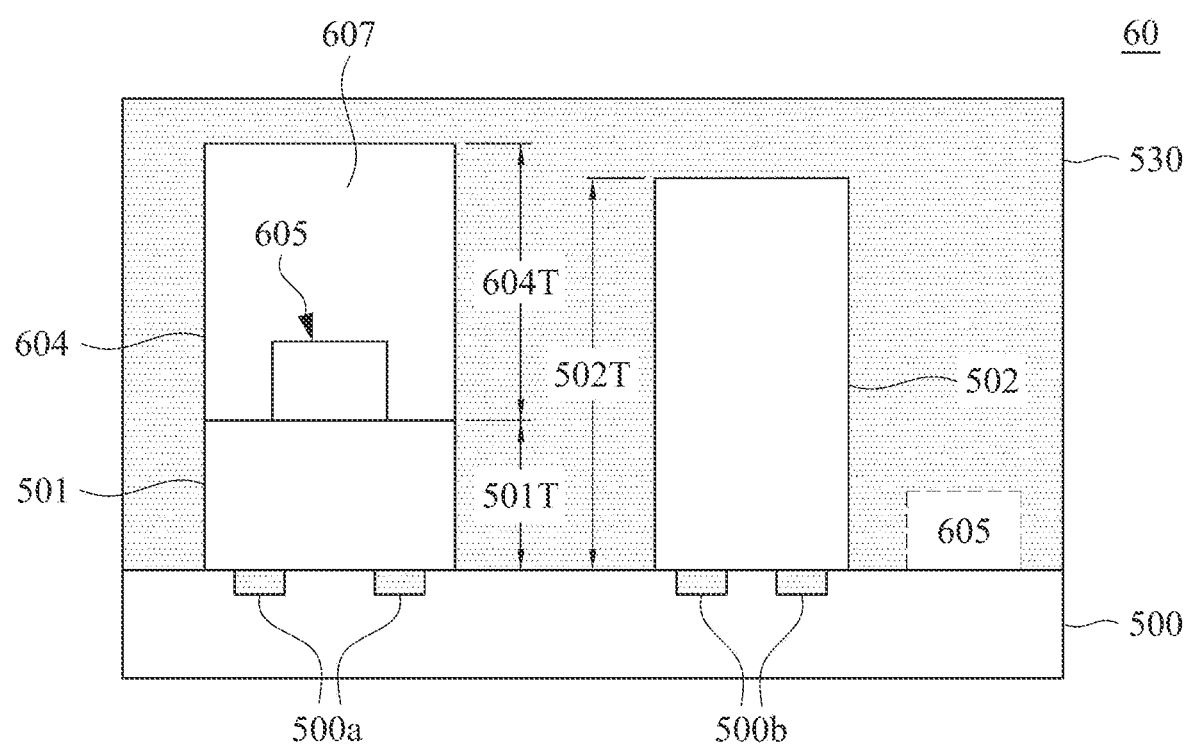
FIG. 6A is a simplified cross-sectional view of a package device according to an embodiment.

In some embodiments, for saving space in a die-group package, a deep-trench capacitor (DTC) device, such as a capacitor device used in a voltage stabilizer, is embedded in a carrier substrate disposed on a die group of the die-group package. FIG. 6A illustrates a simplified view of an example die-group package 60 having a DTC device embedded in a carrier substrate of the die-group package. The package device 60 is similar to the package device 50 with the difference that a stress relief feature is adhered to the first die group for compensating for a height difference between the first and second die groups. Referring to FIG. 6A, the package device 60 includes a carrier substrate 604 mounted on an upper surface of the first die group 501. The carrier substrate 604 has a thickness 604T, where a sum of the thickness 604T and the first thickness 501T of the first die group 501 is at least equal to or greater than the second thickness 502T. Furthermore, the carrier substrate 604 includes at least a trench containing a dielectric material 607. In some embodiments, the carrier substrate 604 can have material characteristics that are similar to the material characteristics of the first die group 501. In some embodiments, the material of the carrier substrate 604 is different from the material of the mold compound so that the mold compound does not transfer or extend stress to the first die group during the molding operation. In an embodiment, the carrier substrate 604 has a material substantially the same as the material of the substrate of the first die group 501. In an embodiment, the dielectric material 607 includes a dielectric constant value similar to those of the dielectric layers in the FEOL or BEOL processes.

In some embodiments, the carrier substrate 604 is a blank carrier substrate without any electronic components formed thereon. The carrier substrate may include glass, ceramic, silicon, silicon oxide, and the like; the air gap is completely encapsulated in the dielectric material to prevent residual moisture and pollutants from entering or remaining in the air gap during and after the forming process. The dielectric material can include a low-k dielectric material.

In an embodiment, the lower surface of the carrier substrate is planarized to adjust the thickness 604T prior to being bonded to the upper surface of the first die group. In an embodiment, the bonding of the carrier substrate to the first die group includes fusion bonding. In an exemplary embodiment, the fusion bonding includes pressing the carrier substrate and the first die group against each other and performing an annealing process to cause the carrier substrate and the first die group to be bonded together due to atomic attraction forces. In an embodiment, the annealing process is performed at a temperature in a range from 500° C. to 1200° C.

As can be seen, in this example, the DTC device 605 is embedded in a carrier substrate 604. As also can be seen, a height 604T of dummy wafer 604 is combined with a height of first die group 501 to be more or less the same as a height 502T of the second die group 502. That is, the combined height 604T+501T is more or less than the height of 502T. In some embodiments, the combined height 604T+501T is within 10% of the height 502T, plus or minus. It is also illustrated in FIG. 6A that a DTC device 605 would otherwise be disposed on the substrate 500 of die-group package 60—shown by the dotted line. This is to illustrate that by moving the DTC device 605 into the carrier substrate 604, a space of the die-group package 60 is improved such that form factor of die-group package 60 can be reduced by reducing or eliminating the space DTC device 605 (shown as the dotted line) occupies. In some embodiments, the space of dotted line DTC device 605 shown in this example may be used to dispose other die-group structure(s).

Figure 6B:
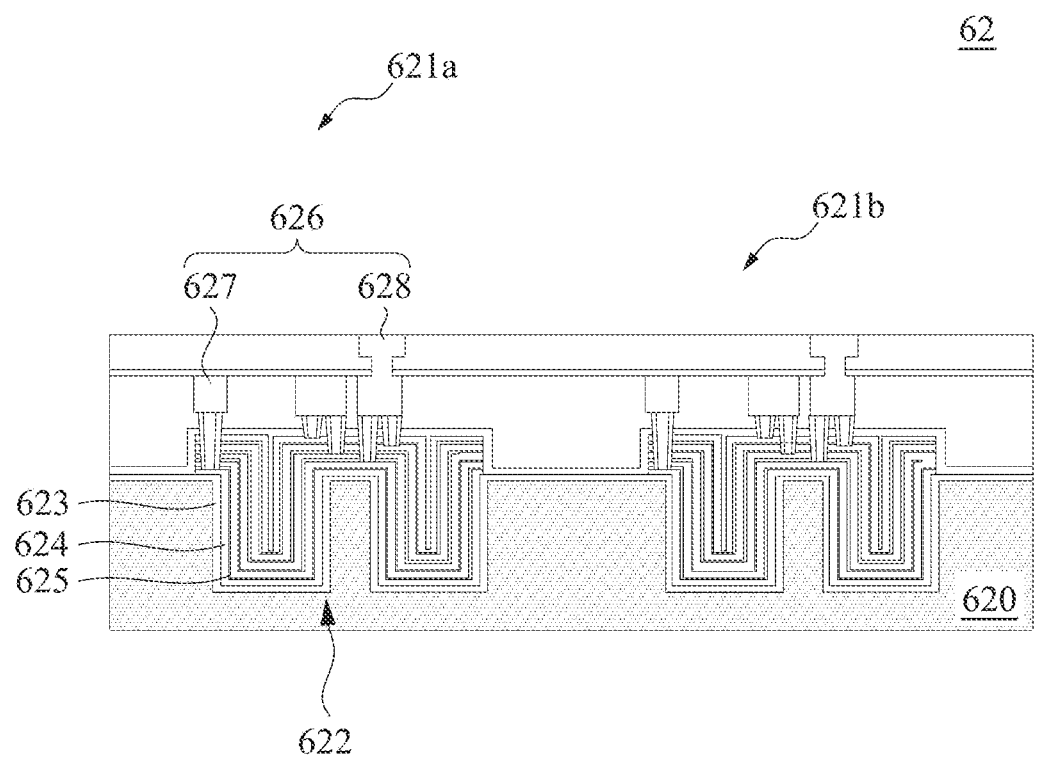
FIG. 6B is a simplified cross-sectional view of a deep trench capacitor (DTC) device according to an embodiment.

FIG. 6B is a simplified cross-sectional view of a deep trench capacitor (DTC) device according to an embodiment. As shown in FIG. 6B, deep trench capacitor (DTC) device 62 includes deep trench capacitors 621a and 621b. Deep trench capacitor 621a includes deep trenches 622 formed in a substrate 620 and a liner 623 disposed at the surface of deep trenches 622. Deep trenches 622 can be formed using a patterned etch process. Liner 623 can be a dielectric layer, for example, SiO2, Si3N4, etc. Alternating electrode metal layers 624 and high K dielectric layer 625 are formed in the trench and can extend over the edges of the trench. The electrode material can be TiN, Ti, polysilicon, or other suitable electrode materials. The high K dielectric layer 625 can be formed using ZrO2, Al2O3-ZrO2, etc., or other suitable High K dielectric materials. In the example of FIG. 6B, deep trench capacitor 621 includes four layers of high K dielectric layer 625 sandwiched between five layers of electrode metal layer 624. The five layers of electrode metal layer 624 are connected by interconnect structures 626 to form two electrodes 627 and 628 of the capacitor. Deep trench capacitor 621b is similar to deep trench capacitor 621a, and is not described in detail. The deep trench capacitor can provide higher capacitance per unit area over other capacitor structures, such as metal-insulator-metal (MIM) capacitors.

The deep trench capacitor (DTC) device 62 is often fabricated as a stand-alone die and packaged with a circuit that requires capacitors, such as illustrated in FIG. 6A. An example of a circuit that requires a capacitor is the voltage stabilizer. A voltage stabilizer, also referred to as a voltage regulator or voltage converter, is a circuit for maintaining the voltage supply to an integrated circuit. Switched mode power converters provide higher efficiency than linear regulators. For example, switched capacitor (SC) converters have been used to provide programmable voltages to integrated circuits, but have mostly been implemented using off-chip capacitors. The switched capacitor converter has several advantages. Integrated capacitors can achieve significantly high capacitance density and low series resistance, enabling SC converters to support high output power. They can be used to implement DC-DC converters in current CMOS processes.

Figure 6C:
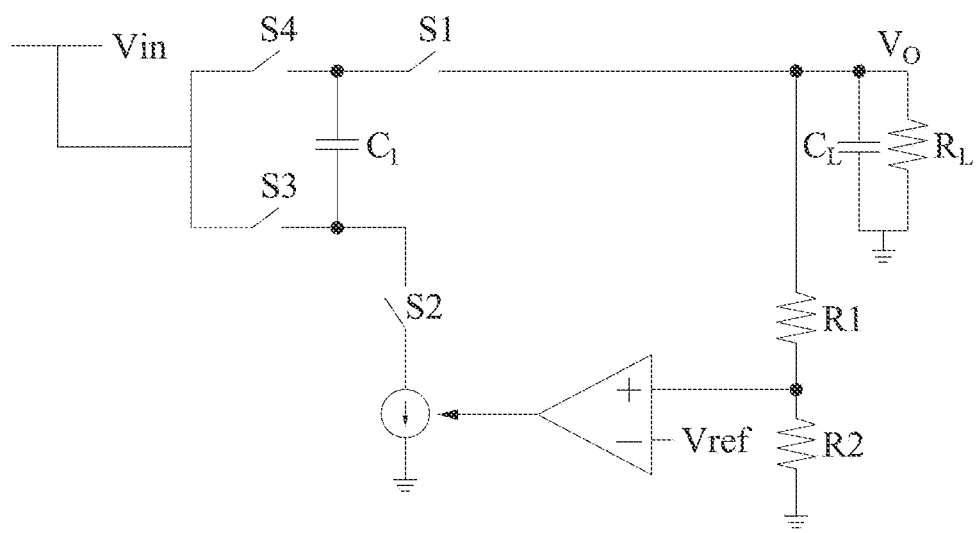
FIG. 6C is a simplified schematic diagram for a voltage stabilizer according to an embodiment.

FIG. 6C is a simplified schematic diagram for a voltage stabilizer according to some embodiments. In FIG. 6C, a voltage stabilizer 67 implemented as a switched capacitor regulator is illustrated. Voltage stabilizer 67 includes four switches S1, S2, S3 and S4, a pump capacitor C1, and a load capacitor CL. A current source I1 provides the charging and discharging current of capacitor C1. A voltage divider formed by resistors R1 and R2 provides a feedback path to amplifier A1, which controls the current source to regulate the output voltage according to a reference signal Vref. In voltage stabilizer 67, capacitors C1 and CL can be implemented with DTC devices described in connection to FIG. 6B. As illustrated in FIG. 6A, DTC device 605 can be embedded in a carrier substrate 604. Carrier substrate 604 is bonded to die group 501, which can include a voltage stabilizer circuit that is coupled to the DTC device 605 in carrier substrate 604. A method of forming such a device is described below with reference to FIG. 7 and FIGS. 8A-8E.

In some embodiments, the device embedded in the carrier wafer is not limited to DTC. Another semiconductor die can be bonded in the trench of the carrier substrate. For example, the semiconductor die can be silicon logic die, processor die, or memory die. The semiconductor die can also be an optical light source or sensor, or a mechanical sensor in a micro-electro-mechanical system (MEMS) die, or the like. In some embodiments, the semiconductor die is bonded in the trench in the carrier substrate using silicon fusion bonding between a substrate of the semiconductor die and the carrier substrate without using of intermediate adhesives.

Figure 7:
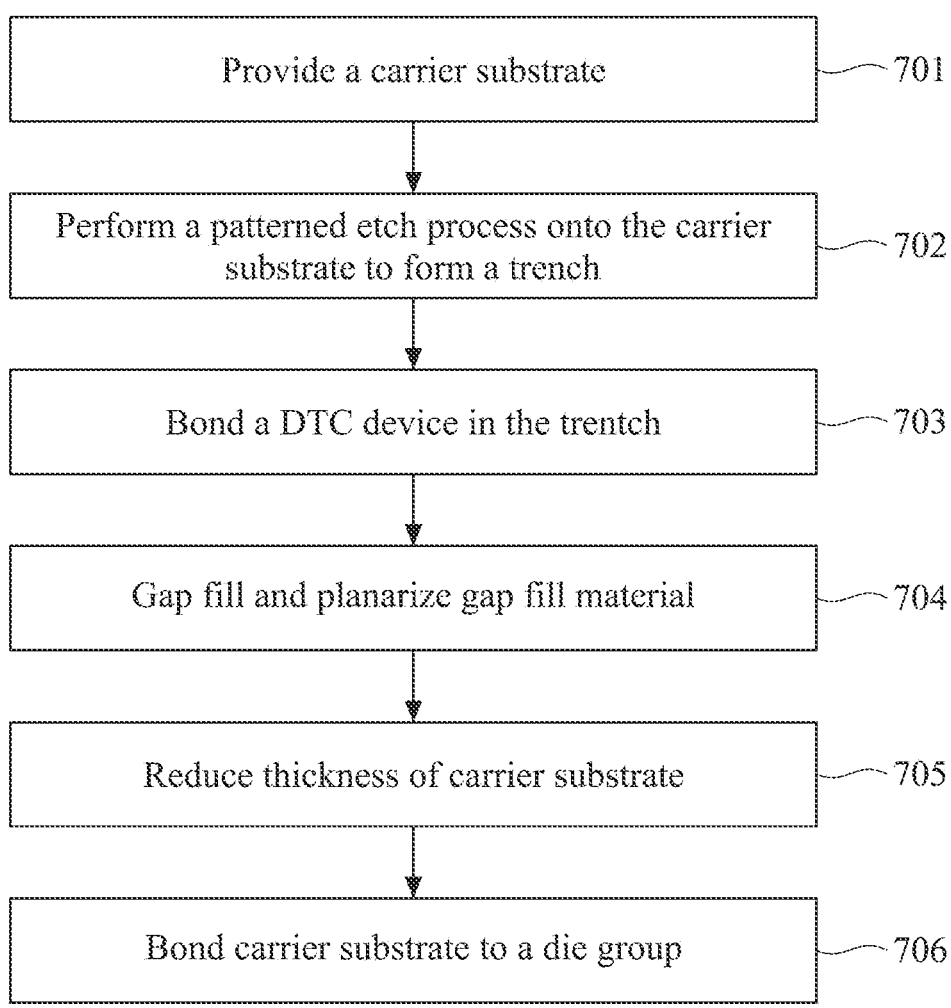
FIG. 7 is a simplified flowchart illustrating a method of fabricating a carrier substrate according to an embodiment.

FIG. 7 is a simplified flowchart illustrating a method 70 of fabricating a carrier substrate having an embedded DTC device for a die-group structure according to some embodiments. FIGS. 8A to 8E are cross-sectional views illustrating intermediate stages of a method of fabricating a carrier substrate according to an embodiment. Method 70 is described below with reference to the cross-sectional views illustrated in FIGS. 8A-8E.

Figure 8A:
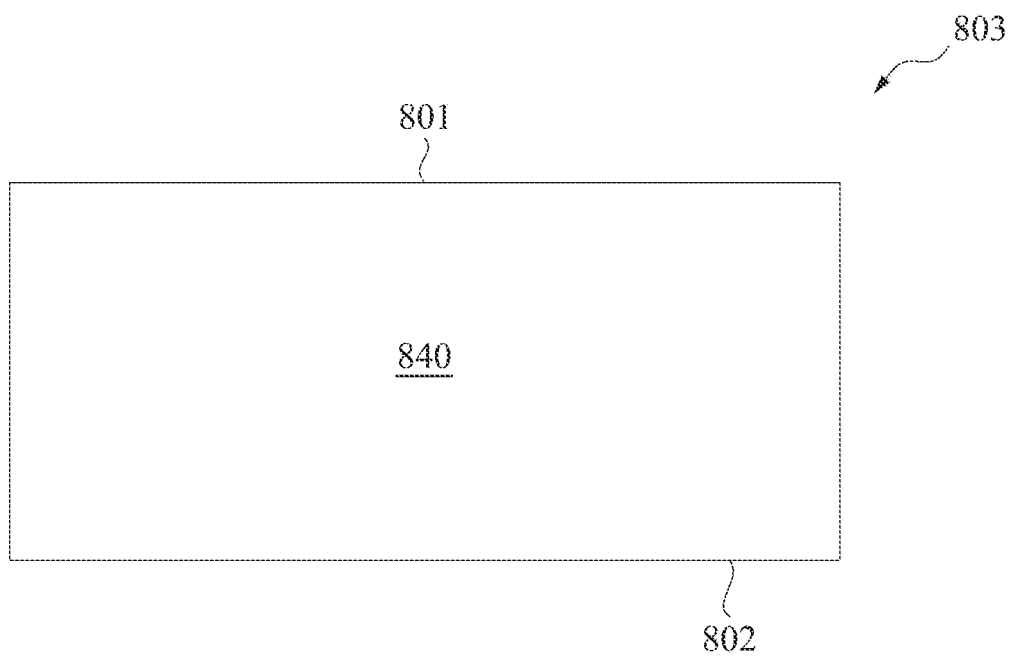
FIGS. 8A to 8E are simplified cross-sectional views illustrating intermediate stages of a method of fabricating a carrier substrate according to an embodiment.

Referring to FIGS. 7 and 8A, the method 70 includes providing a carrier substrate 840 having a first surface 801 and a second surface 802 opposite the first surface (step 701). In an embodiment, the carrier substrate can include silicon. In some embodiments, the carrier substrate provided at 701 is the same or substantially similar to the dummy wafer 540 and 604 shown and described in connection with FIGS. 5-6. As mentioned, in some embodiments, carrier substrate provided at 701 is to compensate for a height difference between two die groups disposed in the die group structure.

Figure 8B:
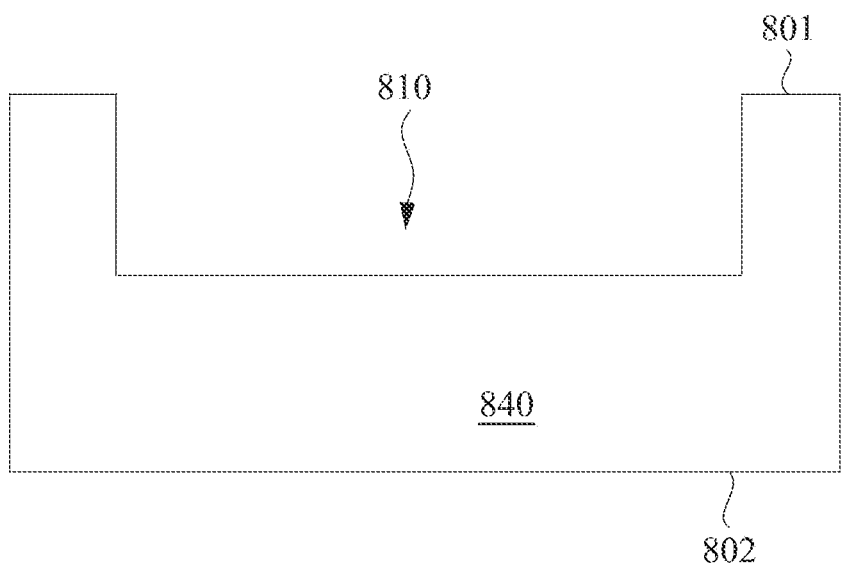

At 702, a patterned etch process is carried out to form a trench 810 in the carrier substrate 840, as shown in FIG. 8B. Here, a patterned mask is formed on the first surface and has an opening. The patterned mask may be formed of a photoresist layer. An etch process is performed onto the carrier substrate using the patterned mask as an etch mask to form a trench. The etch process can be a wet process, a dry process, or a combination thereof.

Figure 8C:
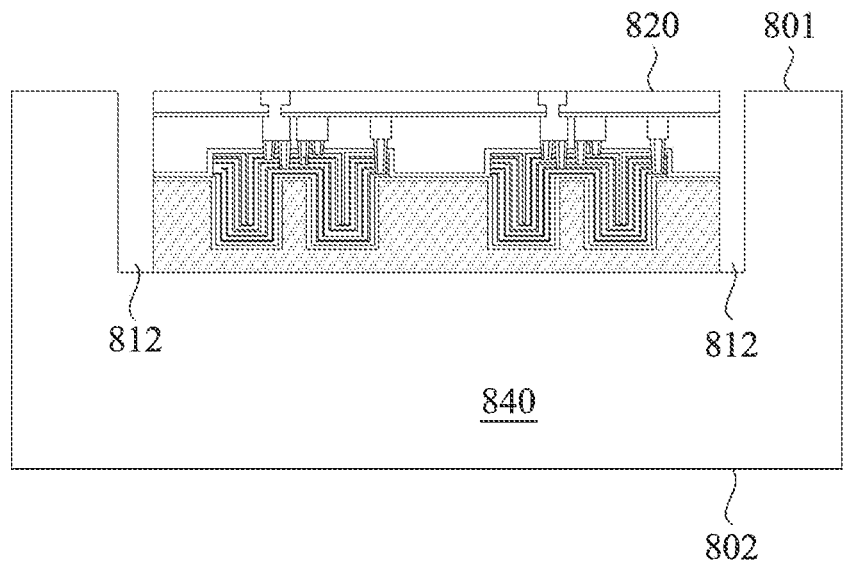

At step 703, a DTC die 820 is bonded to the carrier substrate 840 in the trench 810, as shown in FIG. 8C. The DTC device or DTC die 820 may be similar to the DTC die 62 shown and described in connection with FIG. 6B. In some embodiments, the bonding process is a fusion bonding between the substrate of the DTC die 820 and the carrier substrate 840 at the bottom of the trench 810. In some embodiments, the back side of the substrate for the DTC die 820 may be thinned before bonding to the trench in the carrier substrate 840.

Figure 8D:
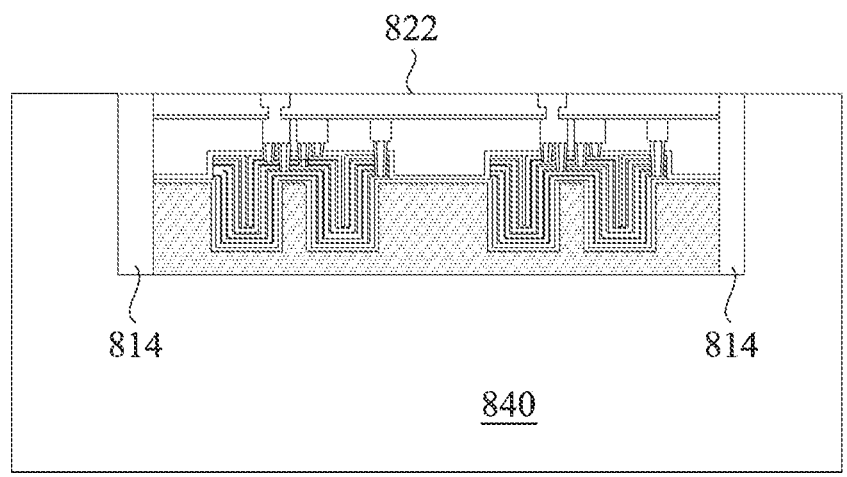

At step 704, a gap fill and planarization process is carried out to form a gap fill material in the gaps between the DTC die and the carrier substrate 840. FIG. 8C shows gaps 812 between the DTC die 820 and the carrier substrate 840. As shown in FIG. 8D, a gap fill material 814 is formed in the gaps 812 between the DTC die 820 and the carrier substrate 840. The top of gap fill material 814 is planarized such that the top surface 822 of the DTC die and the top surface of the gap fill material 814 are co-planar to the first surface 801 of carrier substrate 840. The gap fill material 814 can be a dielectric material such as TEOS, $SiO_2$, or the like. The gap fill material 814 can be formed by a deposition process, such as chemical vapor deposition (CVD), plasma enhanced chemical vapor deposition (PECVD), etc.

At step 705, the thickness of carrier substrate 840 is reduced by a polishing or etching process at the backside or second surface 802 of the carrier substrate. As described below with reference to the flowchart in FIG. 10. The thickness of the thinned carrier substrate is determined to compensate for the height differences between die groups in a multiple die group device. Alternatively, step 705 is postponed until after the carrier substrate 840 is bonded to die group 850. In other words, in this alternative embodiments, steps 705 is executed after step 706 described below.

Figure 8E:
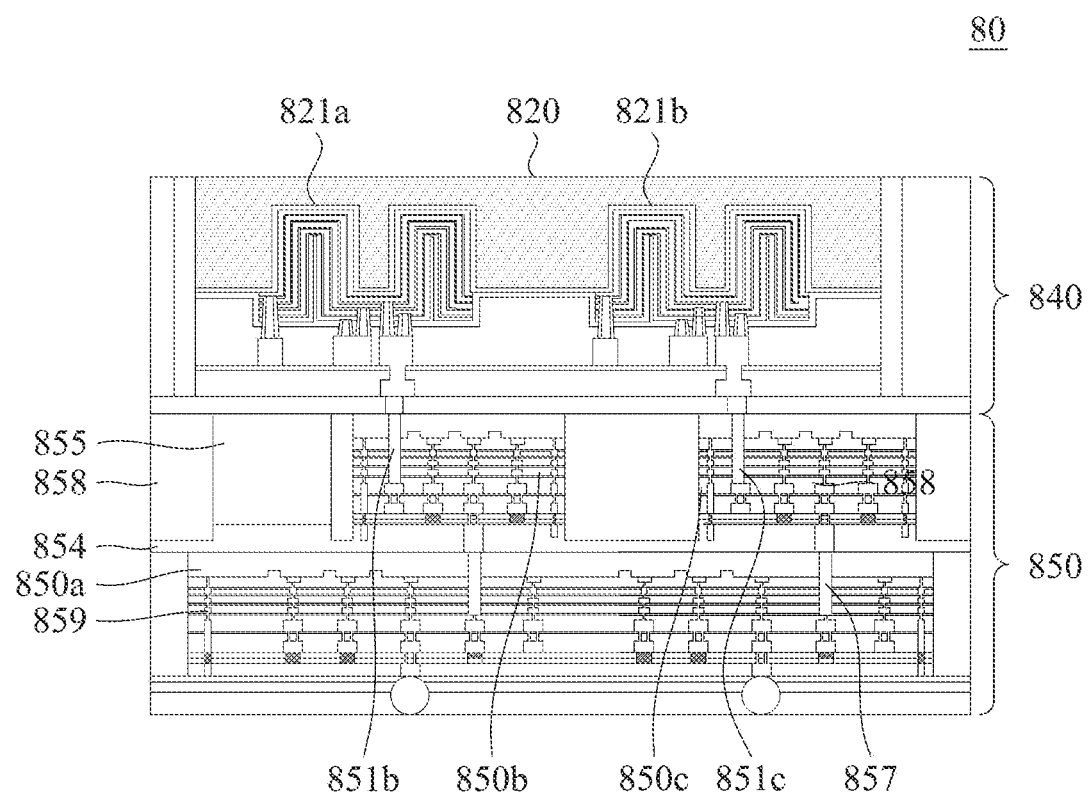

At step 706, the thinned carrier substrate 840 including the embedded DTC 820 is bonded to a die group 850. FIG. 8E is a cross-sectional view illustrating a package device according to some embodiments. Referring to FIG. 8E, the package device 80 includes a first die group 850. In an embodiment, the first die group 850 includes bumps configured to be bonded to a base substrate (not shown), which can be an interposer or another die group. The bumps may be solder balls, conductive bumps, ball grid arrays, or the like.

The first die group 850 may be similar to the die group 30 of FIG. 3C or die group 501 of FIG. 5B, and the second die group 920 may be similar to the die group 40 of FIG. 4, or die group 502 of FIG. 5C. In an embodiment, the first die group 850 includes a first die 850a disposed in a first plane level, a second die 850b, and a third die 850c disposed in a second plane level, where the second and third dies are hybrid bonded to the first die 850a by a metal-to-metal bonding through the through-substrate vias 857 and oxide-to-oxide (dielectric) layer 854 bonding at a temperature from about 100° C. to 200° C. and a pressure in a range from about 0.7 bar to about 10 bar. In some embodiments, a dummy layer 855 is disposed in the second plane level and configured to provide mechanical stability to the second plane level when the second plane level does not have sufficient die density. The first die group 850 also includes an around-die dielectric layer (e.g., TEOS, SiO2) 858 surrounding the first die 850a in the first plane level and the second and third dies 850b, 850c in the second plane level. The first die group 850 also includes a seal ring 859 surrounding each of the first, second, and third dies 850a, 850b, and 850c and configured to prevent moisture from entering the dies.

Referring to FIG. 8E, the carrier substrate 840 is similar to carrier substrate 840 of FIG. 8D. The carrier substrate 840 includes a silicon substrate having a trench and a DTC device 820 embedded in the trench. In this example, DTC device 820 includes deep trench capacitors 821a and 821b. Further, dies 850b and 850c in the first die group 850 include voltage stabilizer circuits, similar to voltage stabilizer 67 described above in connection to FIG. 6C. In some embodiments, DTC 820 is coupled to the voltage stabilizer circuits in dies 850b and 850c in the first die group by through-substrate vias (TSVs) 851b and 851c.

Figure 9:
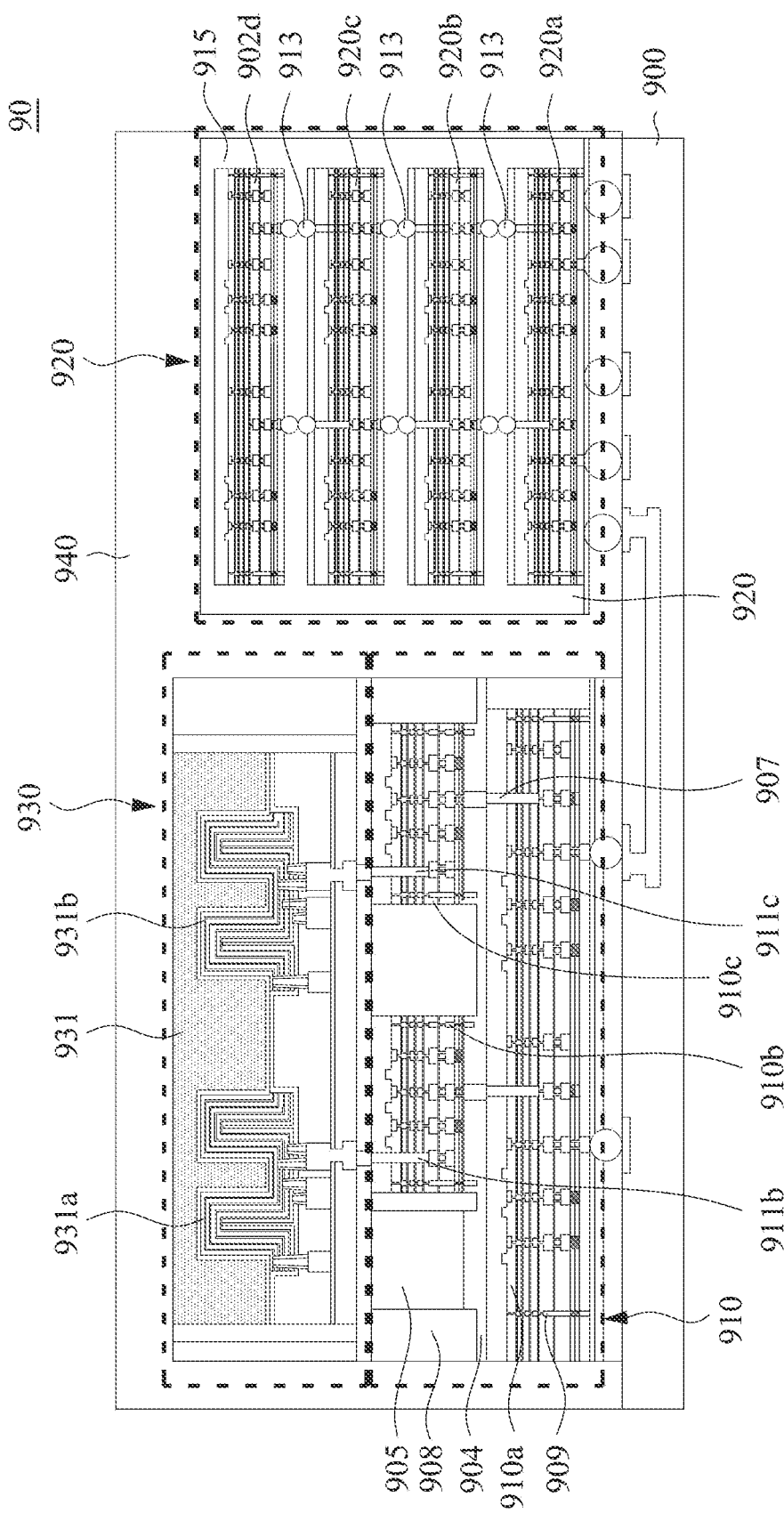
FIG. 9 is a simplified cross-sectional view illustrating a package device according to an embodiment.

FIG. 9 is a cross-sectional view illustrating a package device according to some embodiments. The package device 90 is similar to the package device 60 of FIG. 6A. Referring to FIG. 9, the package device 90 includes a first die group 910 and a second die group 920 flip-chip bonded to a substrate 900. In an embodiment, the first die group 910 and the second die group 920 each include bumps configured to be bonded to the substrate 900. The bumps may be solder balls, conductive bumps, ball grid arrays, or the like.

The first die group 910 may be similar to the die group 30 of FIG. 3C or die group 501 of FIG. 5B, and the second die group 920 may be similar to the die group 40 of FIG. 4, or die group 502 of FIG. 5C, or die group 850 of FIG. 8E. In an embodiment, the first die group 910 includes a first die 910a disposed in a first plane level, a second die 910b, and a third die 910c disposed in a second plane level, where the second and third dies are hybrid bonded to the first die 910a by a metal-to-metal bonding through the through-substrate vias 907 and oxide-to-oxide (dielectric) layer 904 bonding at a temperature from about 100° C. to 200° C. and a pressure in a range from about 0.7 bar to about 10 bar. In some embodiments, a dummy layer 905 is disposed in the second plane level and configured to provide mechanical stability to the second plane level when the second plane level does not have sufficient die density. The first die group 910 also includes an around die dielectric layer (e.g., TEOS, SiO2) 908 surrounding the first die 910a in the first plane level and the second and third dies 910b, 910c in the second plane level. The first die group 910 also includes a seal ring 909 surrounding each of the first, second, and third dies 910a, 910b, and 910c and configured to prevent moisture from entering the dies.

In an embodiment, the second die group 920 includes a first die 920a, a second die 920b, a third die 920c, and a fourth die 920d bonded to each other through conductive bonding structures 913. In an embodiment, the first, second, third, and fourth dies are electrically and mechanically connected to a plurality of conductive bonding structures 913. The second die group 920 also includes a molding compound layer 915 that encapsulates the dies 920a through 920d and fills air gaps between the dies.

The first die group 910 and the second die group 920 may have different heights (thickness) and CTEs. When the first die group and the second die group are encapsulated in a molding compound, the height difference between the first and second die groups may induce uneven top stress to the die group that has a smaller height. The inventor has discovered that molding stress can cause warpage and delamination of the first die group when the height difference is greater than a certain percentage height range of the second die group. The inventor provided herein a solution by mounting a carrier substrate 930 on an upper surface of the first die group 910 to compensate for the height difference, thereby reducing the uneven top stress of the first die group.

Referring to FIG. 9, the carrier substrate 930 is similar to carrier substrate 840 of FIG. 8E. The carrier substrate 930 includes a silicon substrate having a trench and a DTC device 931 embedded in the trench. In this example, DTC device 931 includes deep trench capacitors 931a and 931b. Further, dies 910b and 910c in the first die group 910 include voltage stabilizer circuits, similar to voltage stabilizer 67 described above in connection to FIG. 6C. In some embodiments, DTC 931 is coupled to the voltage stabilizer circuits in dies 910b and 910c in the first die group by through-substrate vias (TSVs) 911b and 911c.

In an embodiment, the carrier substrate 930 has a height or thickness that is characterized by a height or thickness difference between the first and second die groups. In an embodiment, the first die group has a first thickness, the second die group has a second thickness, and the sum of the thickness of the carrier substrate and the first thickness of the first die group is equal to or greater than the second thickness of the second die group. The carrier substrate 930 and the first die group 910 are hybrid bonded together. In some embodiments, the carrier substrate 930 may include a glass substrate, quartz, resin, or silicon substrate. In some embodiments, the carrier substrate 930 may be attached to a top surface of the first passivation layer using an adhesion layer. The carrier substrate can relieve mechanical and thermal stress applied to the first die group. The carrier substrate can support the die package from being warped. A fabrication process of the carrier substrate including the encapsulated air gap and the thickness adjustment has been described with reference to FIGS. 7 through 8E, so that a detailed description is omitted herein for the sake of brevity.

Referring still to FIG. 9, the package device 90 also includes an encapsulating layer 940 on the substrate 900 and covering the first die group 910 and the second die group 920. In an embodiment, the encapsulating layer 940 may include a molding material similar to the mold compound 530. As described with reference to FIG. 5A, in an embodiment, the encapsulating layer 940 may include organic polymers, ceramics, glasses, or plastics that have a viscosity higher than the viscosity of deionized water.

Figure 10:
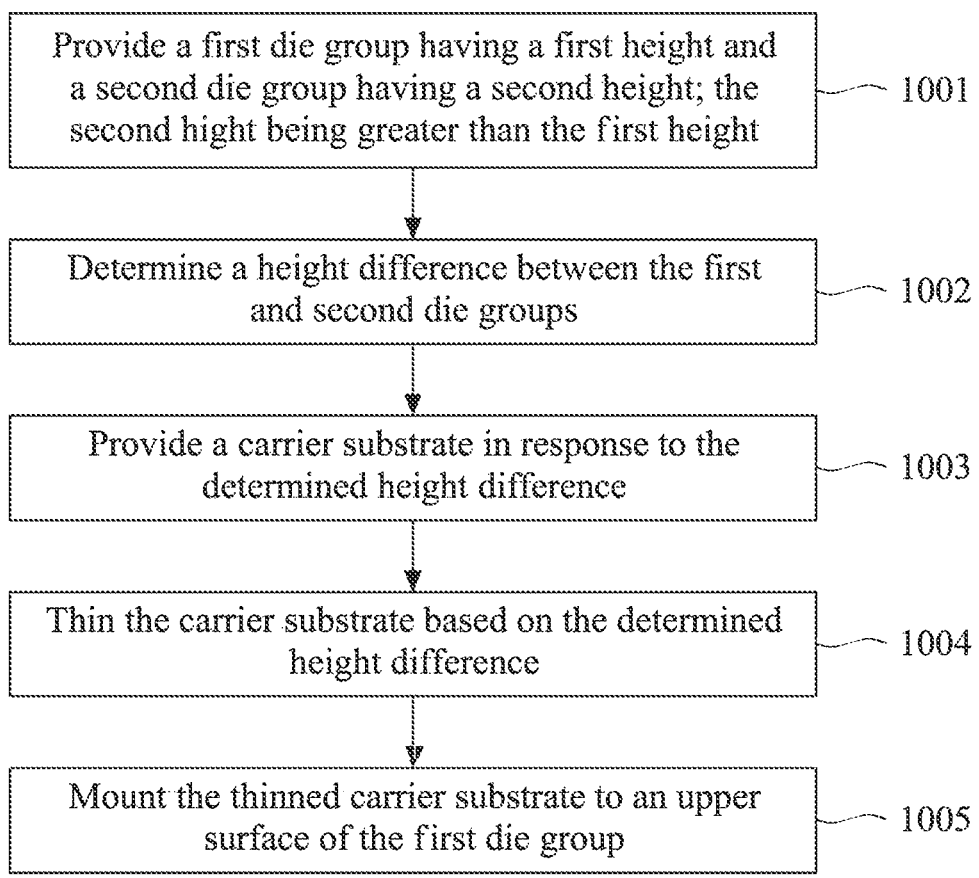
FIG. 10 is a simplified flowchart illustrating a method of adjusting a thickness of a device according to an embodiment.

FIG. 10 is a simplified flowchart illustrating a method 100 of adjusting a thickness of a device according to an embodiment. Referring to FIG. 10, the method 100 includes, at step 1001, providing a first die group and a second die group, the first die group having a first height or thickness, and the second die group having a second height or thickness, the second height or thickness being greater than the first height or thickness. At step 1002, the method 100 includes determining a height or thickness difference between the first and second die groups. In an embodiment, when the height difference is greater than a certain percentage of the second height of the second die group, the method 100 will take corrective action to reduce the height difference. In an exemplary embodiment, the method 100 will take corrective action when the height difference is greater than 30 percent of the second height of the second die group. At step 1003, in response to the determined height or thickness difference, the method 100 further includes providing a carrier substrate that is substantially free of electronic devices. In an embodiment, the carrier substrate is a blank silicon substrate. The carrier substrate can be formed using a fabrication process as shown in FIG. 7 through FIG. 8E. At step 1004, the method 100 includes thinning the carrier substrate to obtain a thinned carrier substrate having a third height or thickness based on the determined height difference. At step 1005, the method 100 includes mounting the thinned carrier substrate to an upper surface of the first die group in order to adjust the height or thickness of the first die group with a height range of the second die group. In an embodiment, the method 100 includes removing a surface portion of the carrier substrate, such that the sum of the first height of the first die group and the third height of the thinned carrier substrate is equal to or greater than the second height of the second die group. Alternatively, step 1004 is postponed until after the carrier substrate is bonded to first die group. In other words, in this alternative embodiments, step 1004 is executed after step 1005. In this case, the carrier substrate is bonded to the first die group before the carrier substrate is thinned based on the determined height difference.

Referring back to FIG. 6, in some embodiments, the mold compound 530 has a thermal expansion coefficient that is different from the material properties of the package substrate 500, the first die group 501, and the second die group 502. Furthermore, the package die 50 can operate with a wide range of operational temperature, e.g., from −40 degrees C. to +150 degrees C. The wide range of temperature can cause thermal stress to the package die 50. The material properties of the package substrate, the dielectric layers, electrically conductive layers, the carrier substrate, and the mold compound have coefficients of thermal expansion (CTE) that vary substantially with temperatures. For example, the CTE of silicon is about 2.5 $10^{-6}$/K (2.5 ppm/° C.) at 20 degrees C., the CTE of copper is about 14 to 19 ppm/° C. at 20 degrees C., the CTE of dielectric is about 0.5 to 8 ppm/° C. at 20 degrees C. The overall CTE of the die groups can be about 2 to about 10 ppm/° C. at 20 degrees C. The CTE of the mold compound can vary more than two orders of magnitude over the temperature −40 degrees C. to +150 degrees C. The large difference in CTEs between the carry substrate and the mold compound can cause warpage to the die groups. As a result, embodiments further provide a stress relief feature that can reduce or eliminate this thermal stress. In an embodiment, the mold compound 530 includes at least one cavity or void disposed between the first and second die groups.

In some embodiments, a package device comprising a base substrate. A first die group includes a first set of one or more dies. The first die group is bonded to the base substrate, and the first die group includes a voltage stabilizer circuit. A second die group, including a second set of one or more dies, is bonded to the base substrate. The height of the second die group is greater than the height of the first die group. A carrier substrate is bonded to the first die group and includes a trench and a deep trench capacitor (DTC) die bonded within the trench. The DTC die is coupled to the voltage stabilizer circuit in the first die group. A combined height of the first die group and the carrier substrate is within 30% of the height of the second die group.

In some embodiments, a semiconductor device includes a package substrate. A first die group and a second die group are bonded onto the package substrate. The first die group is characterized by a first thickness, and the second die group is characterized by a second thickness. The semiconductor device also includes a carrier substrate bonded on the first die group. The carrier substrate includes a trench with a semiconductor die bonded therein. The carrier substrate is characterized by a third thickness that is determined based a difference between the first thickness and the second thickness.

In some embodiments, a method of forming a package device includes providing a carrier substrate, forming a trench in a front side of the carrier substrate, and bonding a semiconductor die in the trench. The method also includes thinning a back side of the carrier substrate based on a target thickness to obtain a thinned carrier substrate. The method further includes providing a first die group and bonding the thinned carrier substrate to the first die group to form a height-adjusted first die group.

The foregoing merely outlines features of embodiments of the disclosure. Various modifications and alternatives to the described embodiments will be apparent to those skilled in the art in view of the teachings herein. Those skilled in the art will appreciate that equivalent constructions do not depart from the scope of the present disclosure, and that they may make various changes, substitutions, and alterations herein without departing from the spirit and scope of the present disclosure.

What is claimed is:

1. A package device comprising:
a base substrate;
a first die group comprising a first set of one or more dies, the first die group being bonded to the base substrate, the first die group including a voltage stabilizer circuit;
a second die group comprising a second set of one or more dies, the second die group bonded to the base substrate, wherein the height of the second die group is greater than the height of the first die group; and
a carrier substrate bonded to the first die group, the carrier substrate comprising a trench and a deep trench capacitor (DTC) die bonded within the trench, the DTC die being coupled to the voltage stabilizer circuit in the first die group;
wherein a combined height of the first die group and the carrier substrate is within 30% of the height of the second die group.

2. The package device of claim 1, wherein the DTC die comprises:
a deep trench capacitor structure disposed at a bottom surface of the trench in the carrier substrate; and
an interconnect structure over the deep trench capacitor structure and coupled to the deep trench capacitor structure.

3. The package device of claim 2, wherein the interconnect structure in the DTC die is coupled to the voltage stabilizer circuit through a trans-silicon-via (TSV) in a substrate in the first die group.

4. The package device of claim 2, wherein the voltage stabilizer circuit comprises a switched capacitor regulator.

5. The package device of claim 1, wherein the first die group is characterized by a first thickness, the second die group is characterized by a second thickness, the carrier substrate is characterized by a third thickness, wherein a sum of the first thickness and the third thickness is equal to or greater than the second thickness.

6. The package device of claim 1, wherein the first die group comprises a first die and a second die that are bonded to each other by hybrid bonding.

7. The package device of claim 1, wherein the carrier substrate is bonded to the first die group by hybrid bonding.

8. A semiconductor device comprising:
a package substrate;

a first die group bonded onto the package substrate, the first die group characterized by a first thickness and comprising a voltage stabilizer circuit;

a second die group bonded onto the package substrate, the second die group characterized by a second thickness; and a carrier substrate bonded on the first die group, the carrier substrate including a trench with a semiconductor die comprising a deep trench capacitor (DTC) die bonded therein, wherein the DTC die is coupled to the voltage stabilizer circuit, and the carrier substrate is characterized by a third thickness that is determined based a difference between the first thickness and the second thickness.

9. The semiconductor device of claim 8, wherein the DTC die comprises:

a deep trench capacitor structure disposed at a bottom surface of the trench in the carrier substrate; and an interconnect structure over the deep trench capacitor structure and coupled to the deep trench capacitor structure.

10. The semiconductor device of claim 9, wherein the interconnect structure in the DTC die is coupled to the voltage stabilizer circuit through a trans-silicon-via (TSV) in a substrate in the first die group.

11. The semiconductor device of claim 8, wherein the semiconductor die is bonded in the trench in the carrier substrate using silicon fusion bonding between a substrate of the semiconductor die and the carrier substrate.

12. The semiconductor device of claim 8, wherein the voltage stabilizer circuit comprises a switched capacitor regulator.

13. The semiconductor device of claim 8, wherein a sum of the first thickness and the third thickness is equal to or greater than the second thickness.

14. A method of forming a package device comprising:

providing a carrier substrate;

forming a trench in a front side of the carrier substrate;

bonding a semiconductor die in the trench, wherein bodING the semiconductor die in the trench comprises:

forming a capacitor structure in a semiconductor substrate;

forming a conductive interconnect structure on the capacitor structure;

thinning the semiconductor substrate from a back side; and bonding the semiconductor substrate in the trench of the carrier substrate;

thinning a back side of the carrier substrate based on a target thickness to obtain a thinned carrier substrate;

providing a first die group; and bonding the thinned carrier substrate to the first die group to form a height-adjusted first die group.

15. The method of claim 14, wherein the capacitor structure comprises a deep trench capacitor (DTC) device; and the capacitor structure is coupled to a voltage stabilizer circuit in the first die group.

16. The method of claim 14, further comprising:

providing a second die group;

determining a height difference between the first die group and the second die group; and setting the target thickness of the carrier substrate based on the determined height difference between the first die group and the second die group.

17. The method of claim 16, further comprising:

mounting the height-adjusted first die group and the second die group to a package substrate; and forming a molding material on the package substrate covering the height-adjusted first die group and the second die group, wherein the molding material comprises a cavity between the height-adjusted first die group and the second die group.

18. The method of claim 16, wherein:

the first die group is characterized by a first height;

the second die group is characterized by a second height;

the thinned carrier substrate is characterized by a third height; and a sum of the first height and the third height is equal to or greater than the second height.

19. The method of claim 15, wherein mounting the thinned carrier substrate to the first die group comprises hybrid bonding.

20. The method of claim 15, wherein the voltage stabilizer circuit comprises a switched capacitor regulator.

* * * * *